US012031863B2

(12) United States Patent
Sugimoto et al.

(10) Patent No.: US 12,031,863 B2
(45) Date of Patent: Jul. 9, 2024

(54) OPTICAL DEVICE INCLUDING MOVABLE MIRROR AND FIRST LIGHT PASSAGE

(71) Applicant: HAMAMATSU PHOTONICS K.K., Hamamatsu (JP)

(72) Inventors: Tatsuya Sugimoto, Hamamatsu (JP); Tomofumi Suzuki, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 312 days.

(21) Appl. No.: 16/625,688

(22) PCT Filed: Jul. 6, 2018

(86) PCT No.: PCT/JP2018/025634
  § 371 (c)(1),
  (2) Date: Dec. 21, 2019

(87) PCT Pub. No.: WO2019/009392
  PCT Pub. Date: Jan. 10, 2019

(65) Prior Publication Data
  US 2020/0124469 A1    Apr. 23, 2020

(30) Foreign Application Priority Data
  Jul. 6, 2017    (JP) .................. 2017-133093

(51) Int. Cl.
  G01J 3/02    (2006.01)
  G01B 9/02    (2022.01)
  (Continued)

(52) U.S. Cl.
  CPC .............. G01J 3/021 (2013.01); G01B 9/02 (2013.01); G02B 26/12 (2013.01); G01J 3/45 (2013.01)

(58) Field of Classification Search
  CPC ...... G01J 3/021; G01J 3/45; G01J 3/06; G01J 3/453; G01B 9/02; G02B 26/12;
  (Continued)

(56) References Cited

U.S. PATENT DOCUMENTS 6,507,138 B1    1/2003 Rodgers et al.
6,541,831 B2    4/2003 Lee et al.
  (Continued)

FOREIGN PATENT DOCUMENTS

CN    1619351 A    5/2005
CN    1650214 A    8/2005
  (Continued)

OTHER PUBLICATIONS

International Preliminary Report on Patentability dated May 28, 2020 for PCT/JP2018/029117.
  (Continued)

Primary Examiner — Hwa Andrew Lee
(74) Attorney, Agent, or Firm — Faegre Drinker Biddle & Reath LLP

(57) ABSTRACT

An optical device includes: a base which includes a main surface; a movable mirror which includes a mirror surface; a first and a second elastic support portions which support the movable mirror so as to be movable along a first direction perpendicular to the main surface; an actuator which moves the movable mirror; and a first optical function portion which is disposed at one side of the movable mirror in a second direction perpendicular to the first direction. The first elastic support portion includes a pair of first levers extending from the movable mirror toward both sides of the first optical function portion in a third direction perpendicular to the first and the second directions. A length of each of first levers in the second direction is larger than the shortest
  (Continued)

distance between an outer edge of the mirror surface and an edge of the first optical function portion.

25 Claims, 21 Drawing Sheets

(51) Int. Cl.
  *G02B 26/12* (2006.01)
  *G01J 3/45* (2006.01)
(58) Field of Classification Search
  CPC .. G02B 26/0841; G02B 26/001; G02B 26/00; B81B 3/00
  See application file for complete search history.

(56) References Cited

U.S. PATENT DOCUMENTS

| | | | |
|---|---|---|---|
| 7,699,296 | B1 | 4/2010 | Knollenberg et al. |
| 8,165,323 | B2 | 4/2012 | Zhou |
| 8,353,600 | B1 | 1/2013 | Fu |
| 8,729,770 | B1 | 5/2014 | Milanovic |
| 11,187,872 | B2 | 11/2021 | Sugimoto et al. |
| 11,635,613 | B2 | 4/2023 | Sugimoto et al. |
| 2001/0044165 | A1 | 11/2001 | Lee et al. |
| 2002/0109894 | A1 | 8/2002 | Clark et al. |
| 2004/0004775 | A1 | 1/2004 | Turner et al. |
| 2004/0081391 | A1 | 4/2004 | Ko et al. |
| 2004/0184135 | A1 | 9/2004 | Miles et al. |
| 2004/0232107 | A1 | 11/2004 | Kouma et al. |
| 2005/0099665 | A1 | 5/2005 | Lee et al. |
| 2005/0194650 | A1 | 9/2005 | Hung |
| 2005/0194840 | A1 | 9/2005 | Mori et al. |
| 2006/0082250 | A1 | 4/2006 | Ko et al. |
| 2008/0123242 | A1 | 5/2008 | Zhou |
| 2008/0198249 | A1 | 8/2008 | Tanimura et al. |
| 2008/0247029 | A1* | 10/2008 | Zhou ............... G02B 26/0841 359/295 |
| 2008/0284078 | A1 | 11/2008 | Wolter et al. |
| 2009/0107949 | A1 | 4/2009 | Kouma et al. |
| 2009/0109512 | A1 | 4/2009 | Park |
| 2009/0225387 | A1 | 9/2009 | Mizuno et al. |
| 2010/0208347 | A1 | 8/2010 | Kouma et al. |
| 2011/0080627 | A1 | 4/2011 | He et al. |
| 2011/0090551 | A1 | 4/2011 | Pirk et al. |
| 2011/0109194 | A1 | 5/2011 | Hung et al. |
| 2011/0205608 | A1 | 8/2011 | Mizoguchi |
| 2012/0099176 | A1 | 4/2012 | Zhou |
| 2012/0160557 | A1 | 6/2012 | Yamada et al. |
| 2012/0162739 | A1 | 6/2012 | Yamada |
| 2012/0236382 | A1 | 9/2012 | Puegner et al. |
| 2013/0083379 | A1 | 4/2013 | Tanaka et al. |
| 2013/0194555 | A1 | 8/2013 | Davis et al. |
| 2013/0321892 | A1 | 12/2013 | Haeberle et al. |
| 2014/0125950 | A1 | 5/2014 | Shimada et al. |
| 2014/0137670 | A1 | 5/2014 | Hata et al. |
| 2014/0300942 | A1 | 10/2014 | Van Lierop et al. |
| 2014/0327946 | A1 | 11/2014 | Van Lierop et al. |
| 2014/0355091 | A1 | 12/2014 | Mizutani |
| 2014/0362460 | A1 | 12/2014 | Nozu et al. |
| 2015/0028698 | A1 | 1/2015 | Gutierrez |
| 2015/0234176 | A1 | 8/2015 | Zhou |
| 2016/0025964 | A1 | 1/2016 | Torayashiki et al. |
| 2016/0216508 | A1 | 7/2016 | Tamamori |
| 2017/0139200 | A1 | 5/2017 | Chang et al. |
| 2021/0132367 | A1 | 5/2021 | Sugimoto et al. |

FOREIGN PATENT DOCUMENTS

| | | |
|---|---|---|
| CN | 1790181 A | 6/2006 |
| CN | 1837892 A | 9/2006 |
| CN | 101246258 A | 8/2008 |
| CN | 101279708 A | 10/2008 |
| CN | 101284642 A | 10/2008 |
| CN | 101290395 A | 10/2008 |
| CN | 101316789 A | 12/2008 |
| CN | 101410744 A | 4/2009 |
| CN | 101786592 A | 7/2010 |
| CN | 101894711 A | 11/2010 |
| CN | 102177465 A | 9/2011 |
| CN | 102265033 A | 11/2011 |
| CN | 102369153 A | 3/2012 |
| CN | 102445752 A | 5/2012 |
| CN | 102667497 A | 9/2012 |
| CN | 102868383 A | 1/2013 |
| CN | 103288034 A | 9/2013 |
| CN | 103803478 A | 5/2014 |
| CN | 203825034 U | 9/2014 |
| CN | 104216109 A | 12/2014 |
| CN | 104272167 A | 1/2015 |
| CN | 104348326 A | 2/2015 |
| CN | 104428439 A | 3/2015 |
| CN | 104964678 A | 10/2015 |
| CN | 105453408 A | 3/2016 |
| CN | 105492879 A | 4/2016 |
| CN | 105594114 A | 5/2016 |
| CN | 105826252 A | 8/2016 |
| CN | 105899995 A | 8/2016 |
| CN | 106500682 A | 3/2017 |
| CN | 106597016 A | 4/2017 |
| CN | 106604887 A | 4/2017 |
| CN | 106707415 A | 5/2017 |
| EP | 1677086 A1 | 7/2006 |
| EP | 3015901 A1 | 5/2016 |
| EP | 3070508 A1 | 9/2016 |
| JP | H8-506857 A | 7/1996 |
| JP | 2000-214407 A | 8/2000 |
| JP | 2002-524271 A | 8/2002 |
| JP | 2002-326197 A | 11/2002 |
| JP | 2003-029178 A | 1/2003 |
| JP | 2004-177543 A | 6/2004 |
| JP | 2004-215534 A | 8/2004 |
| JP | 2004-325578 A | 11/2004 |
| JP | 2005-010453 A | 1/2005 |
| JP | 2005-275198 A | 10/2005 |
| JP | 2006-343481 A | 12/2006 |
| JP | 2007-155965 A | 6/2007 |
| JP | 2007-183400 A | 7/2007 |
| JP | 2007-188073 A | 7/2007 |
| JP | 2008-055516 A | 3/2008 |
| JP | 2008-083122 A | 4/2008 |
| JP | 2009-171394 A | 7/2009 |
| JP | 2010-008611 A | 1/2010 |
| JP | 2010-029976 A | 2/2010 |
| JP | 2010-054944 A | 3/2010 |
| JP | 2010-085506 A | 4/2010 |
| JP | 2010-128116 A | 6/2010 |
| JP | 2010-184334 A | 8/2010 |
| JP | 2011-069954 A | 4/2011 |
| JP | 2011-175044 A | 9/2011 |
| JP | 2012-042666 A | 3/2012 |
| JP | 2012-108165 A | 6/2012 |
| JP | 2012-133242 A | 7/2012 |
| JP | 2012-184962 A | 9/2012 |
| JP | 2012-198298 A | 10/2012 |
| JP | 2012-524295 A | 10/2012 |
| JP | 2012-528343 A | 11/2012 |
| JP | 2013-009447 A | 1/2013 |
| JP | 2013-016651 A | 1/2013 |
| JP | 2013-080068 A | 5/2013 |
| JP | 2013-148707 A | 8/2013 |
| JP | 2014-006418 A | 1/2014 |
| JP | 2014-023207 A | 2/2014 |
| JP | 2014-035429 A | 2/2014 |
| JP | 2014-115267 A | 6/2014 |
| JP | 2014-215534 A | 11/2014 |
| JP | 2014-235260 A | 12/2014 |
| JP | 2014-238581 A | 12/2014 |
| JP | 2015-093340 A | 5/2015 |
| JP | 2015-102483 A | 6/2015 |
| JP | 2015-102709 A | 6/2015 |
| JP | 2015-219516 A | 12/2015 |
| JP | 2016-085299 A | 5/2016 |

(56) References Cited

FOREIGN PATENT DOCUMENTS

| JP | 2016-114798 A | 6/2016 |
|---|---|---|
| JP | 2016-151681 A | 8/2016 |
| JP | 2016-200834 A | 12/2016 |
| JP | 2016-212221 A | 12/2016 |
| JP | 2017-058418 A | 3/2017 |
| JP | 2017-070163 A | 4/2017 |
| JP | 2017-129783 A | 7/2017 |
| TW | 201531709 A | 8/2015 |
| TW | I563290 B | 12/2016 |
| TW | 201717371 A | 5/2017 |
| TW | 201718896 A | 6/2017 |
| TW | I588533 B | 6/2017 |
| WO | WO 94/018697 A1 | 8/1994 |
| WO | WO-00/013210 A2 | 3/2000 |
| WO | WO 2009/124607 A1 | 10/2009 |
| WO | WO-2010/121185 A1 | 10/2010 |
| WO | WO-2010/136358 A2 | 12/2010 |
| WO | WO 2011/091012 A2 | 7/2011 |
| WO | WO-2013/046612 A1 | 4/2013 |
| WO | WO 2015/068400 A1 | 5/2015 |
| WO | WO 2016/002453 A1 | 1/2016 |

OTHER PUBLICATIONS

English-language translation of International Preliminary Report on Patentability (IPRP) dated May 28, 2020 that issued in WO Patent Application No. PCT/JP2018/032760.
Sandner, Thilo et al., "Out-of-plane translatory MEMS actuator with extraordinary large stroke for optical path length modulation in miniaturized FTIR Spectrometers," SENSOR+TEST Conferences 2011, Proceedings IRS2, Jun. 9, 2011, p. 151-p. 156.
International Preliminary Report on Patentability dated Jan. 16, 2020 for PCT/JP2018/025634.
International Preliminary Report on Patentability dated Jan. 16, 2020 for PCT/JP2018/025637.
International Preliminary Report on Patentability dated Jan. 16, 2020 for PCT/JP2018/025640.
International Preliminary Report on Patentability dated Jan. 16, 2020 for PCT/JP2018/025635.
International Preliminary Report on Patentability dated Jan. 16, 2020 for PCT/JP2018/025636.
International Preliminary Report on Patentability dated Jan. 16, 2020 for PCT/JP2018/025638.
International Preliminary Report on Patentability dated Jan. 16, 2020 for PCT/JP2018/025639.
Sun Fengming et al., "MEMS Based Micro Displacement Sensor and Its Application", Chinese Journal of Sensors and Actuators, vol. 26, No. 2, Feb. 2013, p. 293-p. 296.
Sandner Thilo et al., "Translatory MEMS actuator and their system integration for miniaturized Fourier transform spectrometers", MOEMS and Miniaturized Systems XI, SPIE, 1000 20th St. Bellingham WA 98225-6705 USA, vol. 8252, No. 1, Mar. 8, 2012, p. 1-p. 10, XP060023646.
Akin Aydemir et al., "A new design and a fabrication approach to realize a high performance three axes capacitive MEMS accelerometer", Sensors and Actuators A Physical, vol. 244, Jun. 15, 2016, p. 324-p. 333.
Anonymous, "Michelson Interferometer—Definition and Applications", URL:https://www.azooptics.com/Article.aspx?Article1D=698, May 6, 2014, XP093017159.

* cited by examiner

Fig.4
(a)
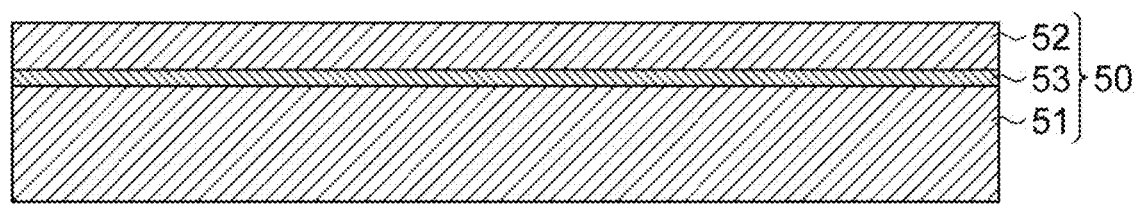
(b)
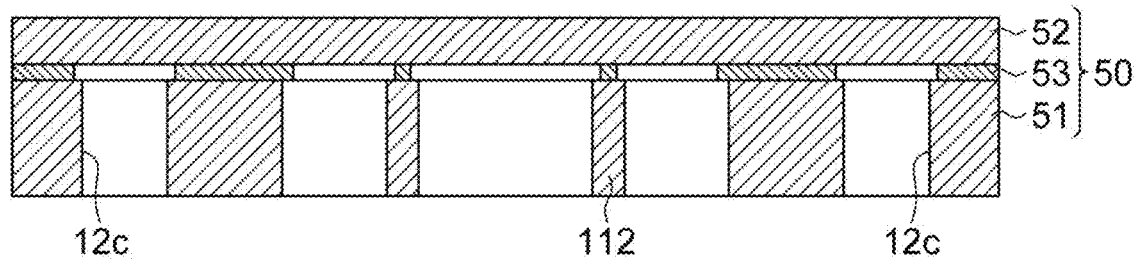

Fig.5
(a)
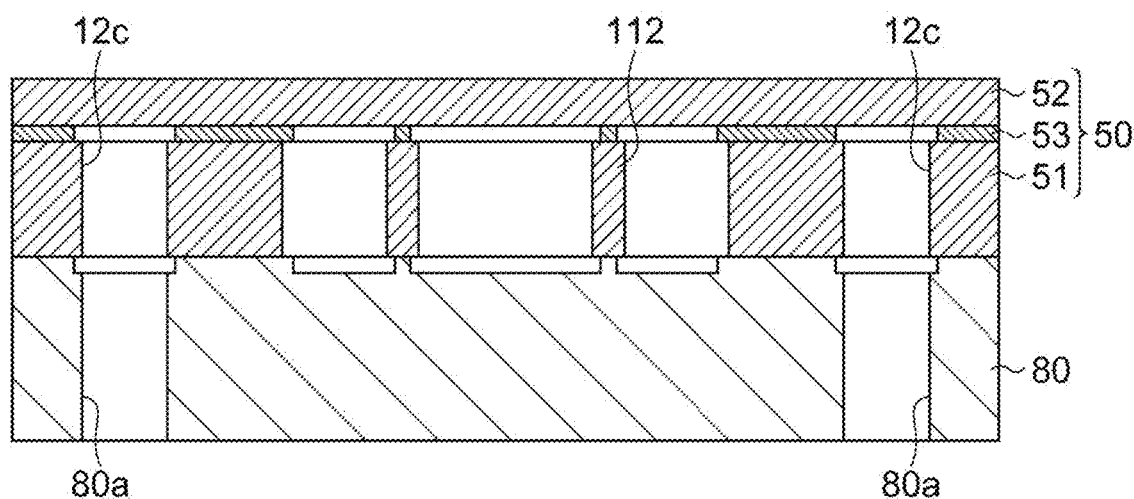
(b)
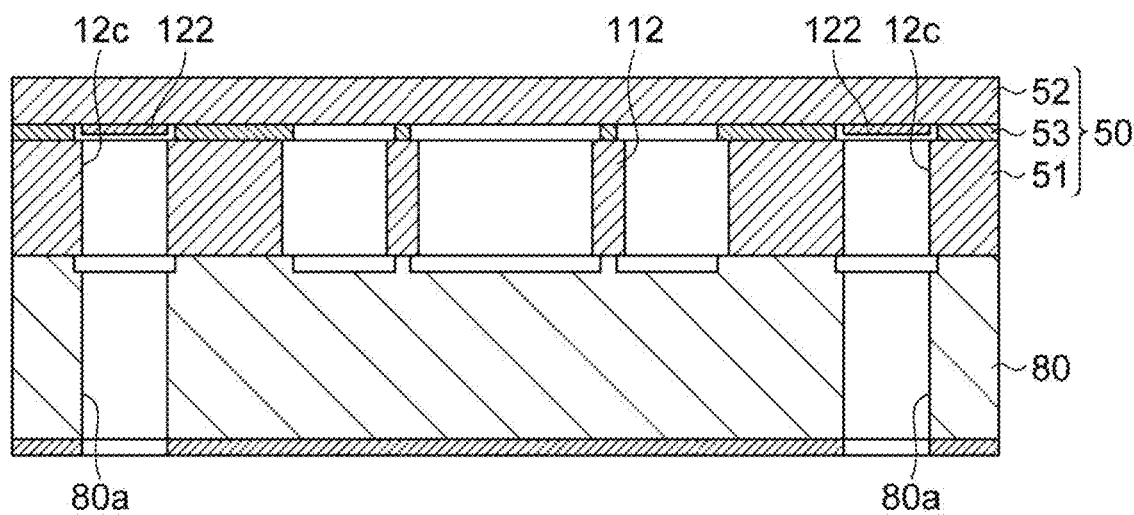

*Fig.6*
(a)
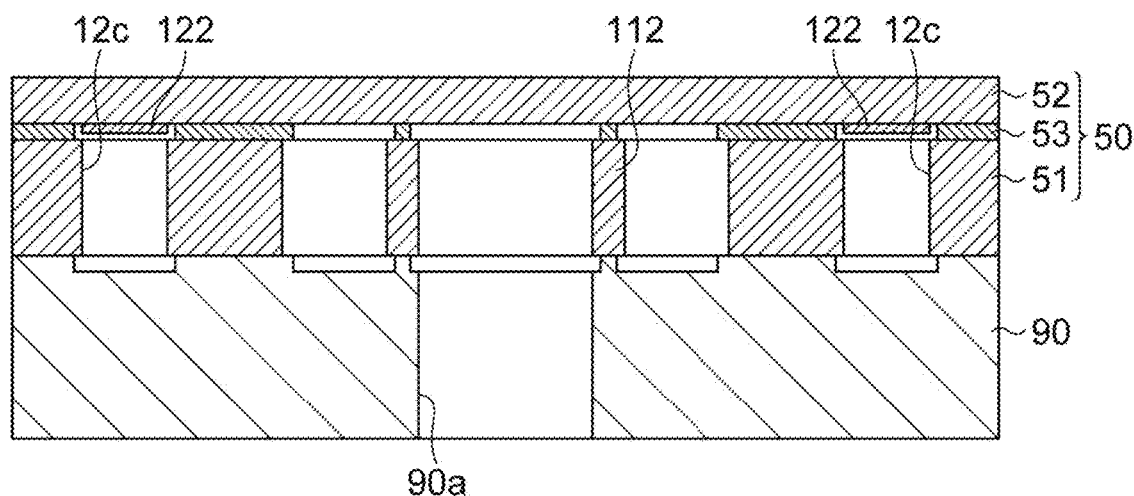
(b)
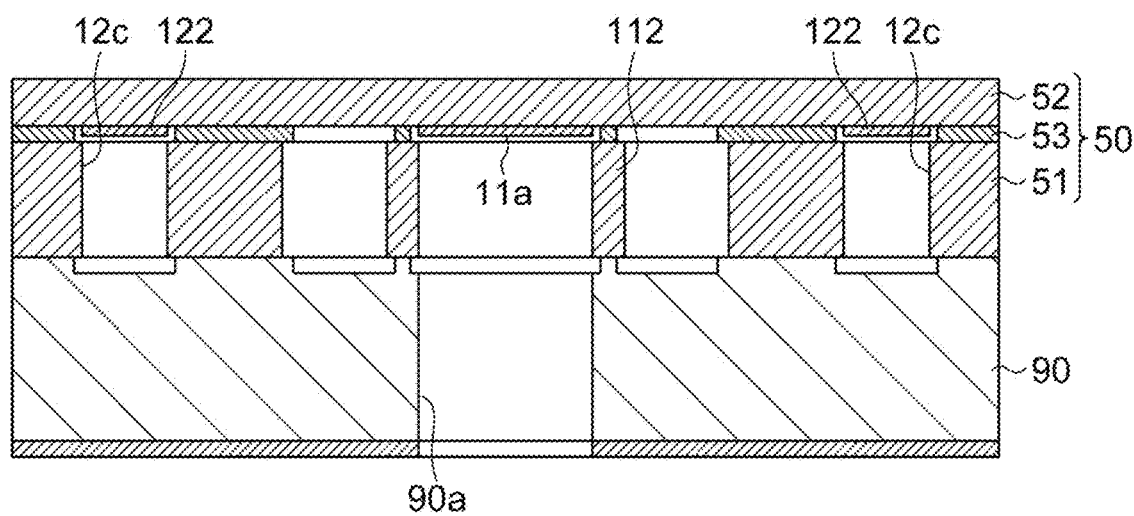

Fig.8
(a)
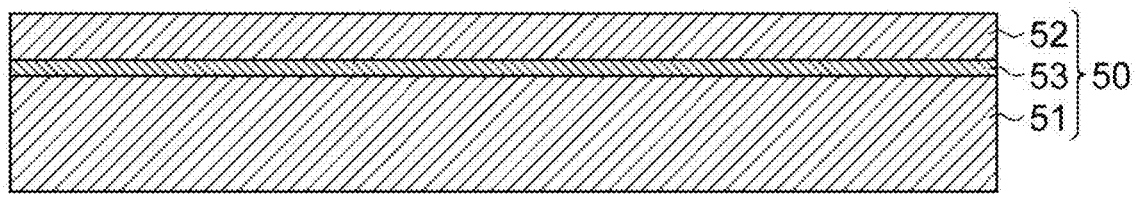
(b)
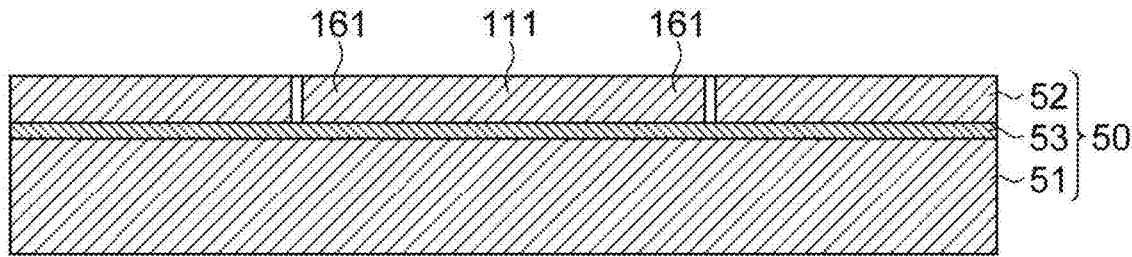

Fig.10
(a)
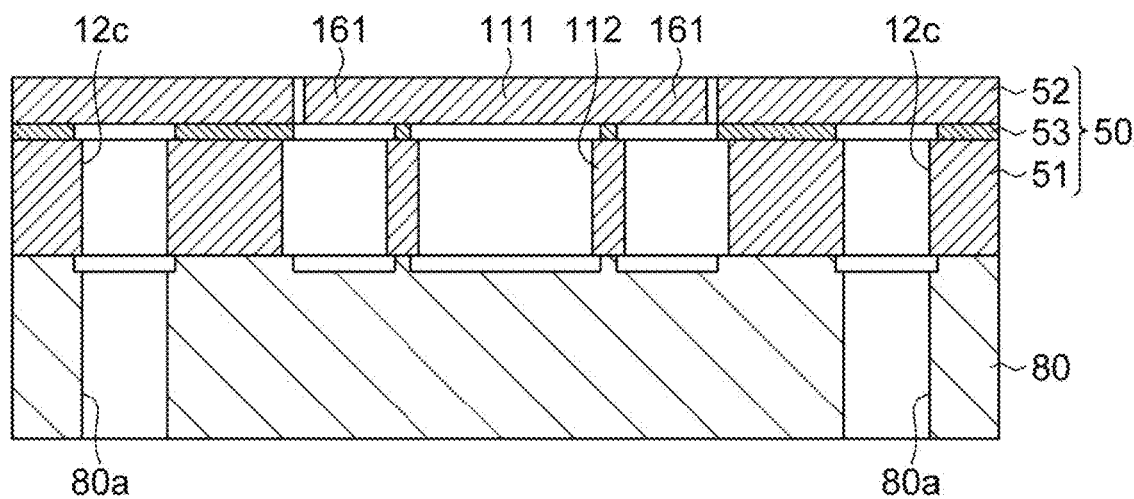
(b)
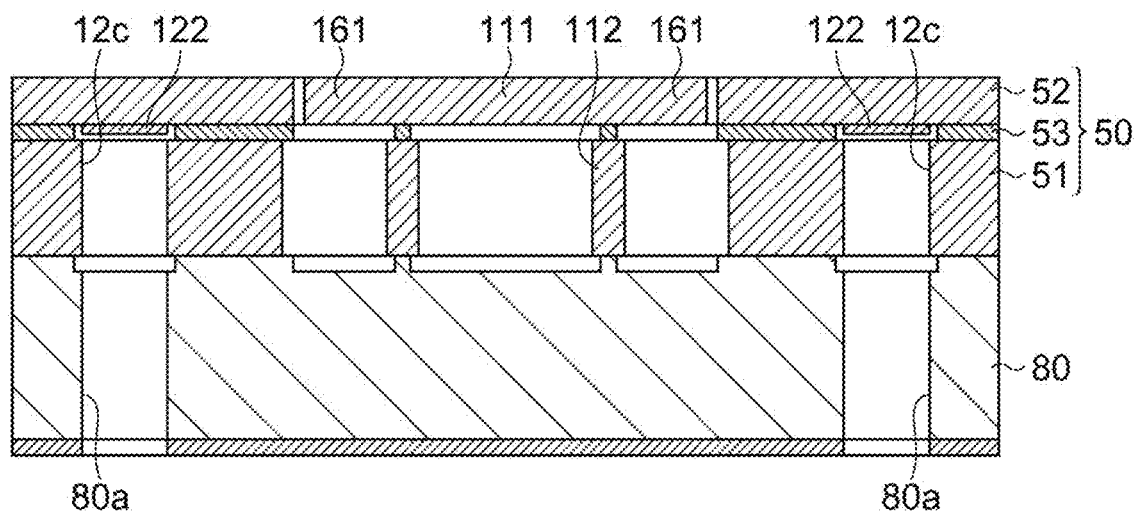

Fig.11
(a)
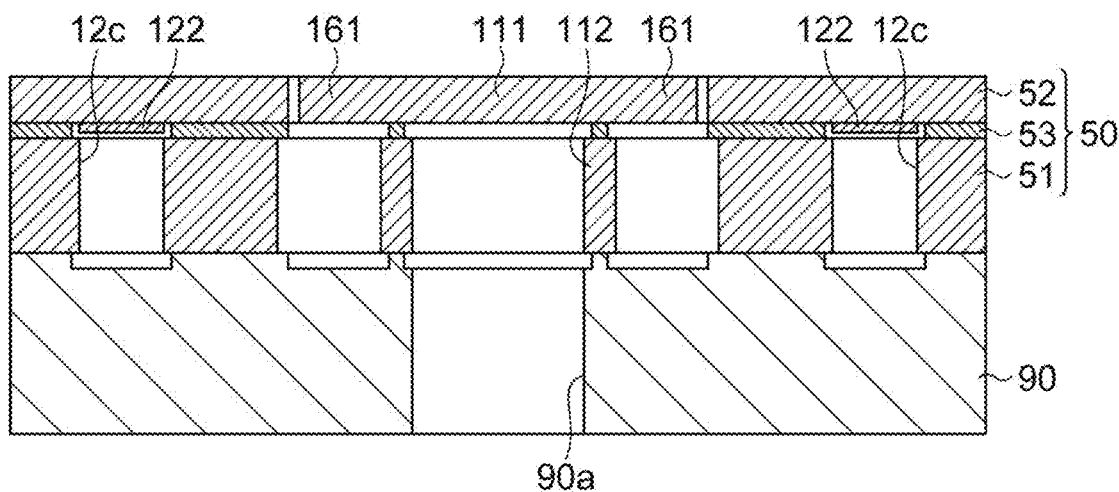
(b)
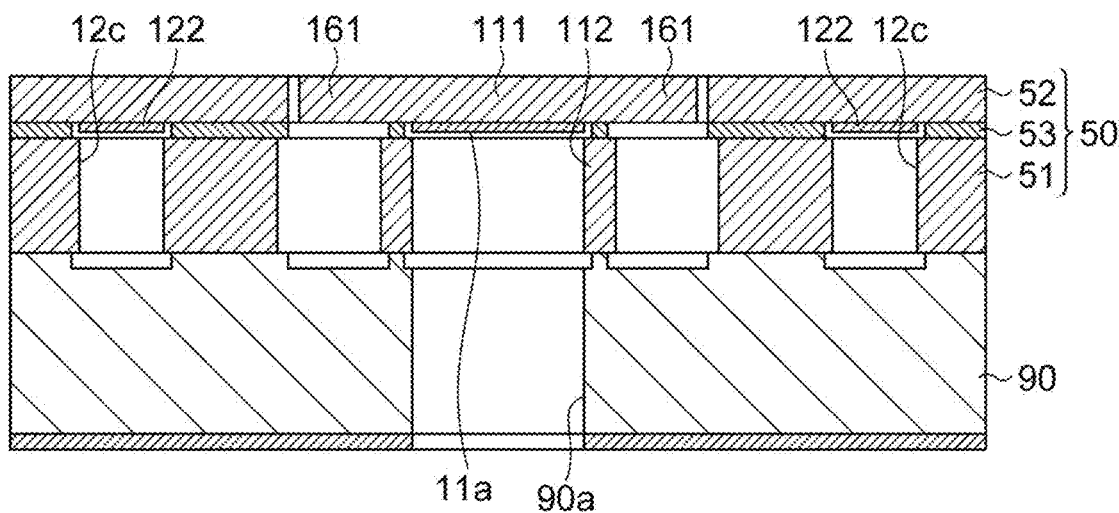
(c)
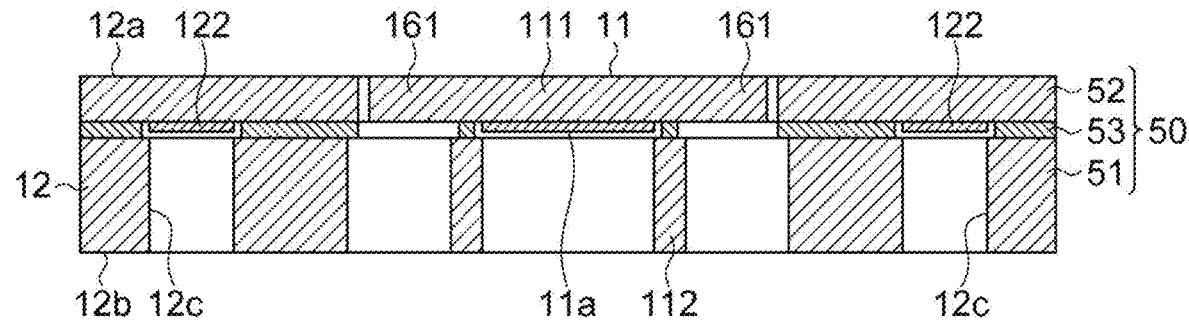

Fig.12
(a)
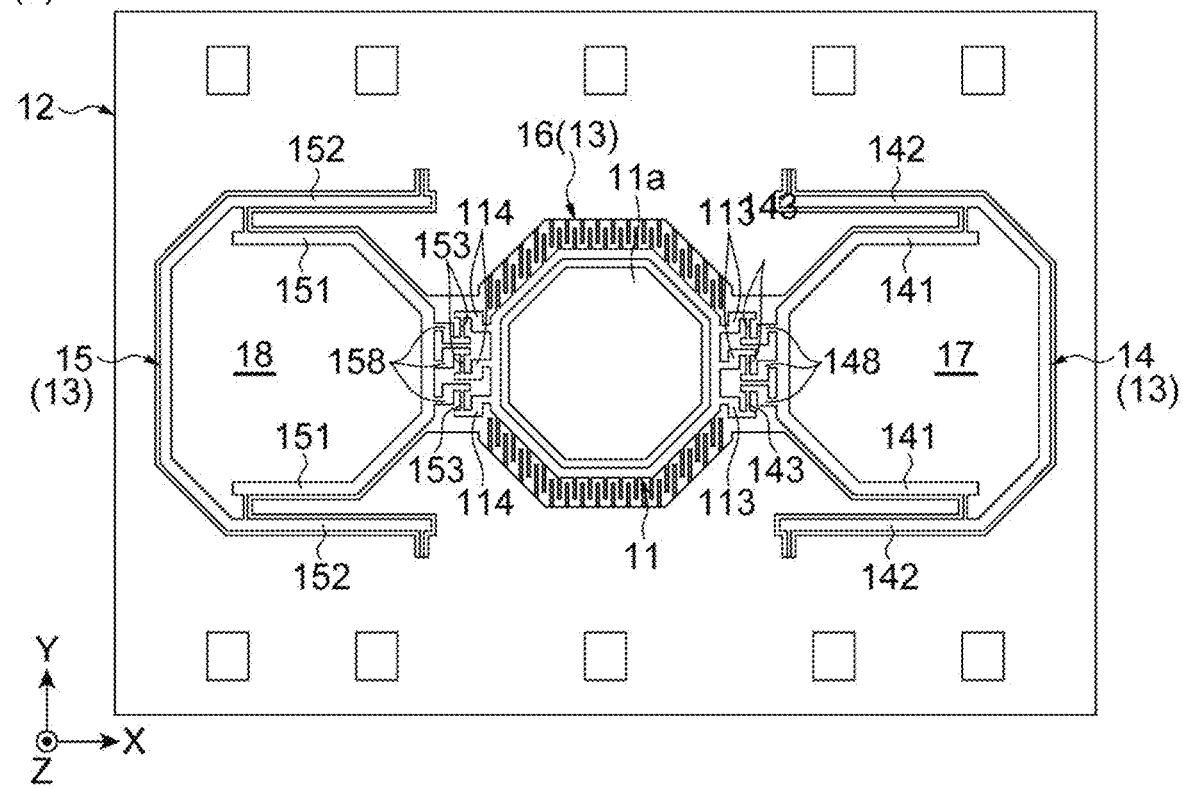
(b)
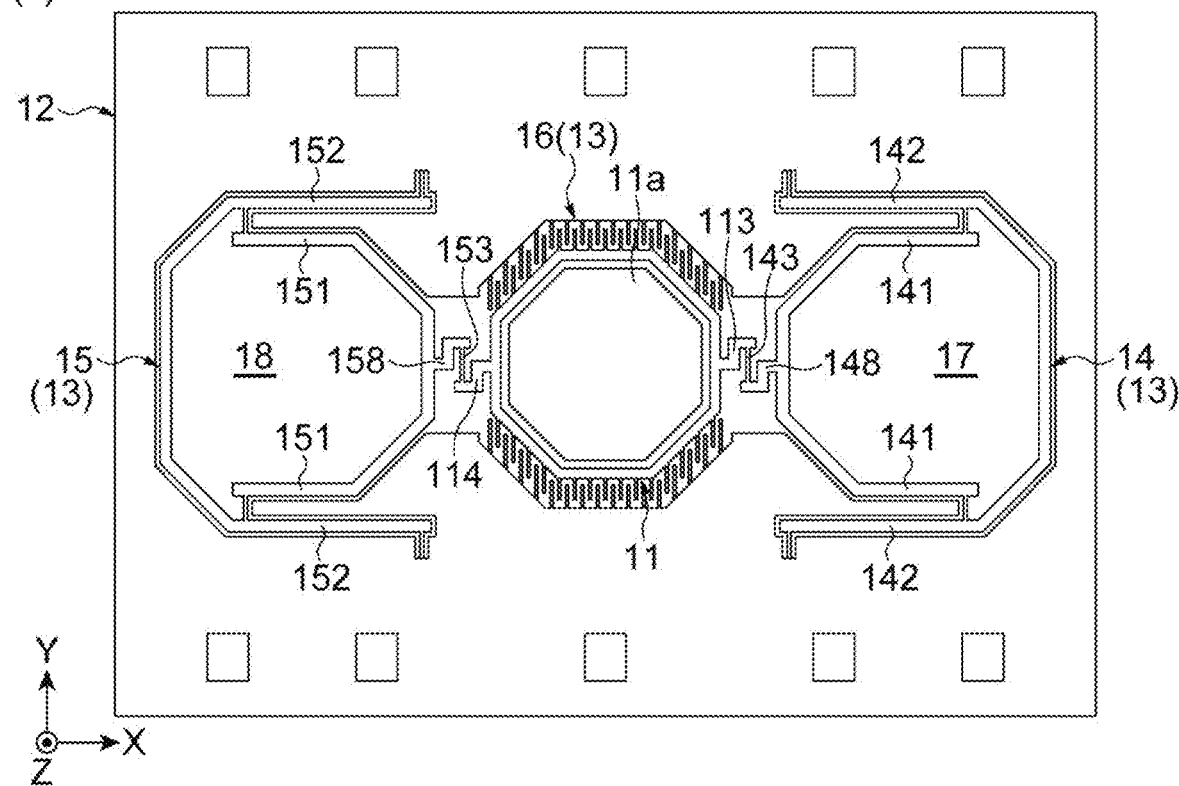

Fig.13
(a)
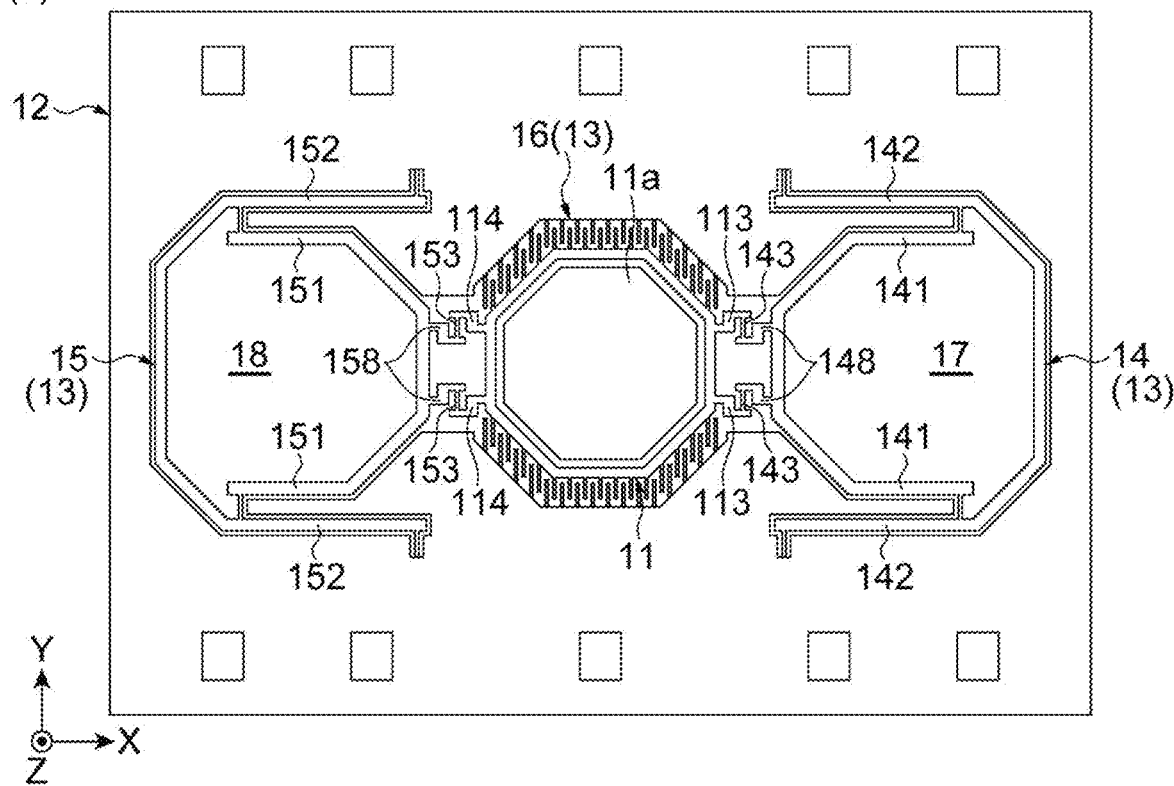
(b)
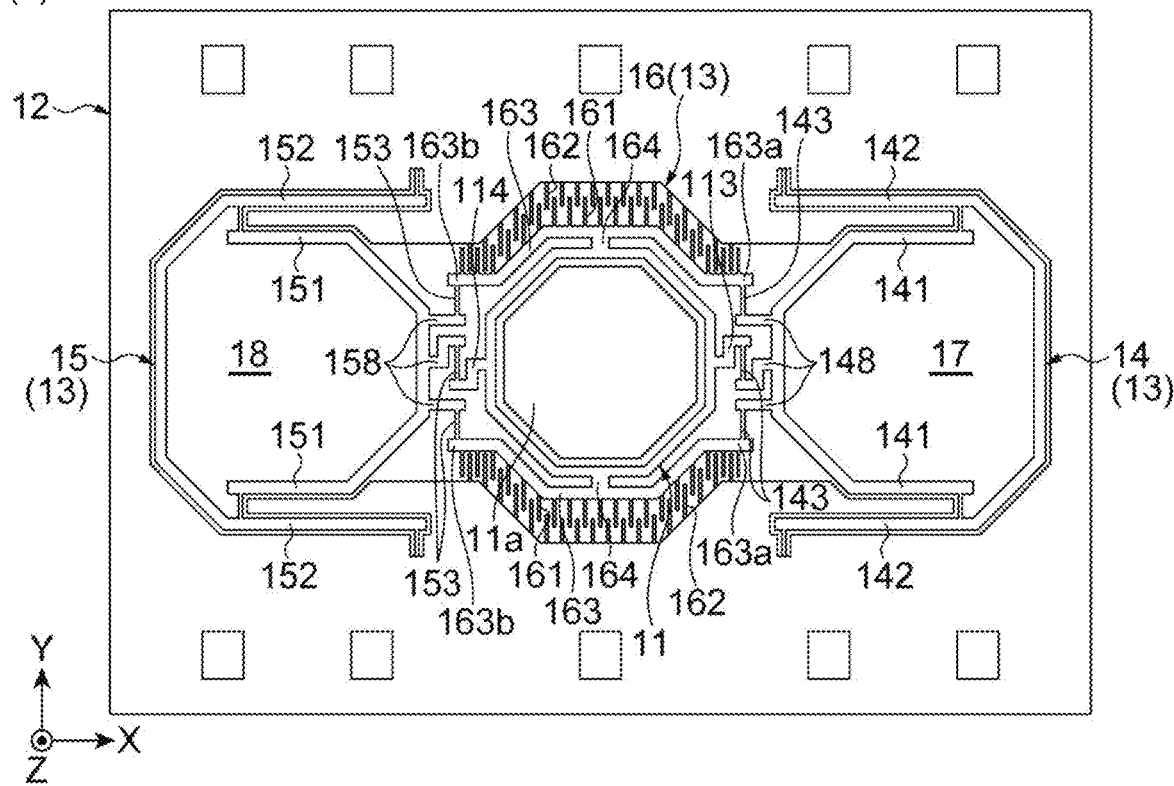

Fig.14
(a)
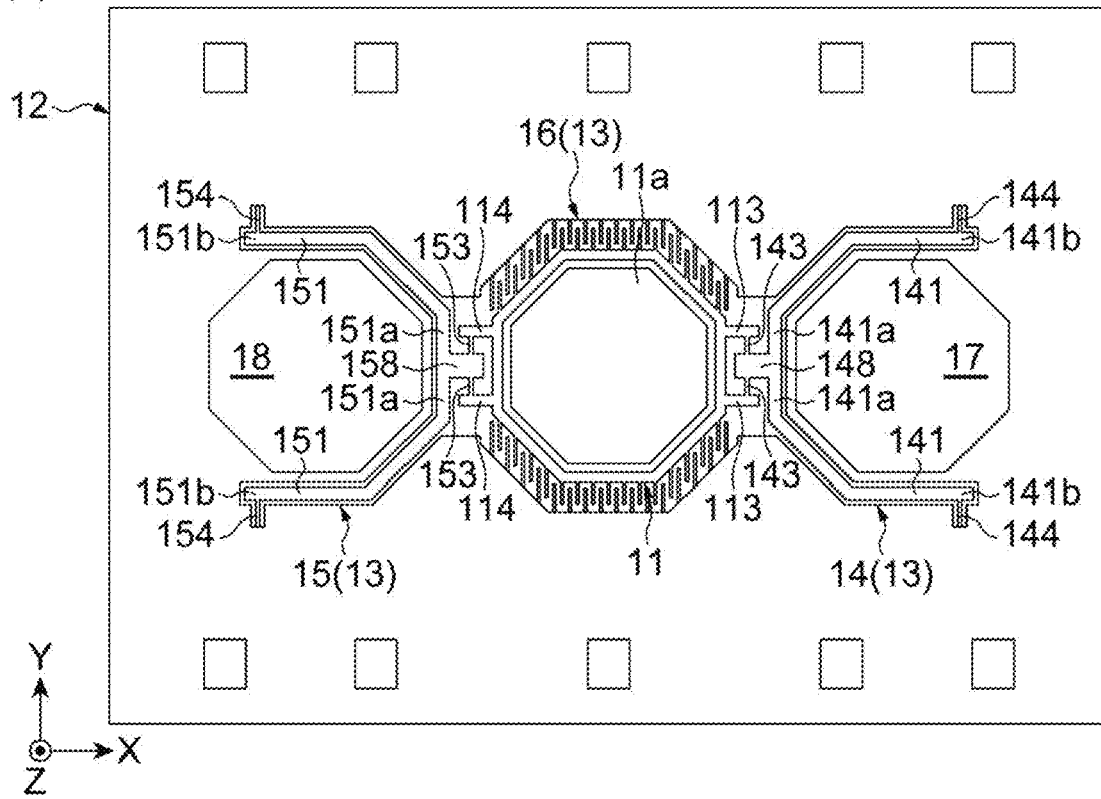
(b)
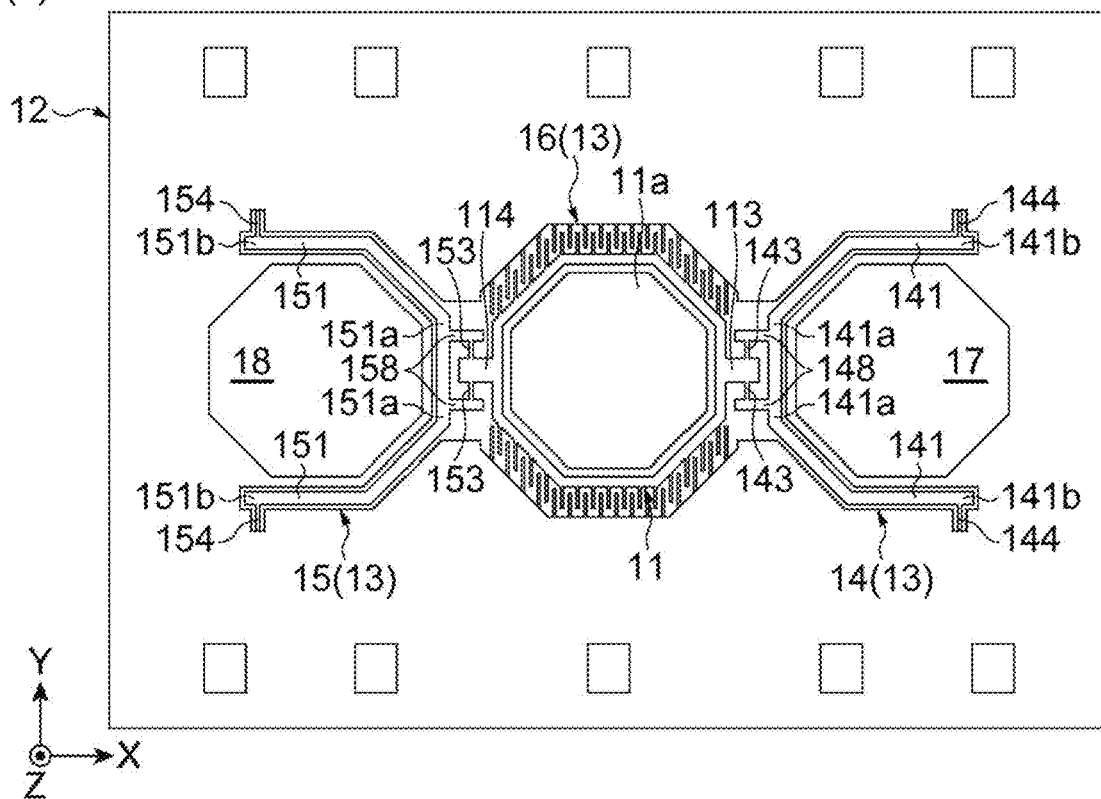

Fig.15
(a)
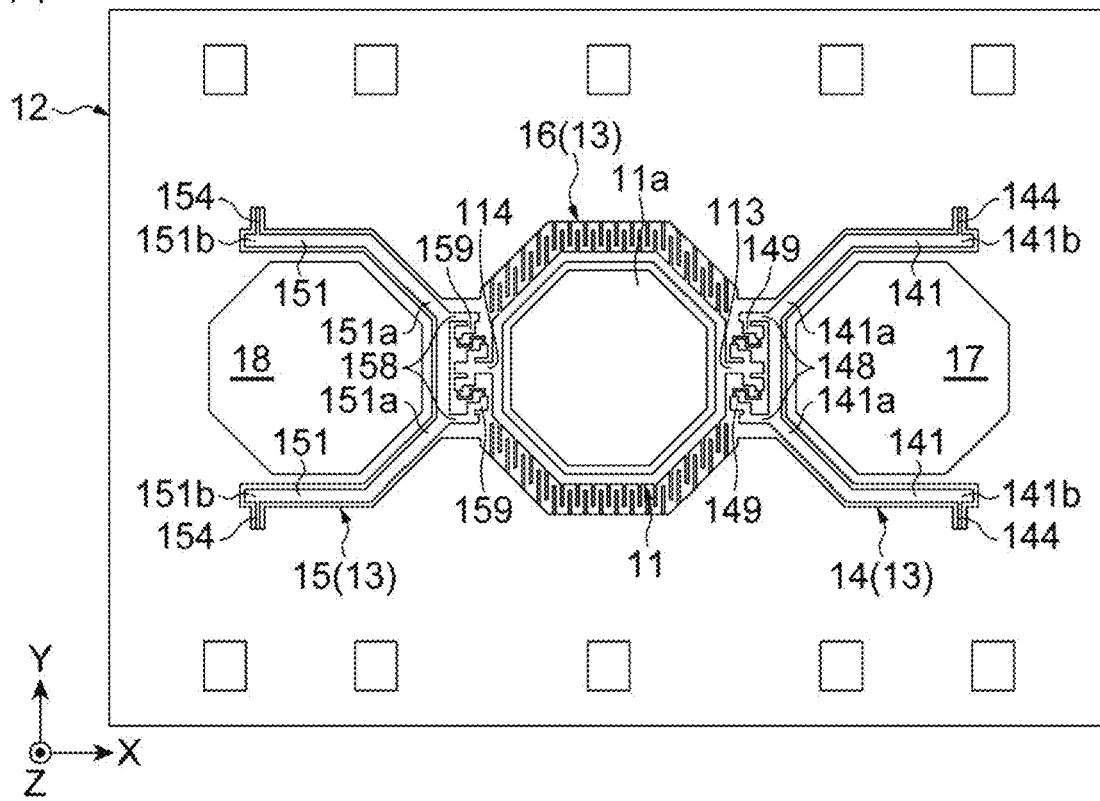
(b)
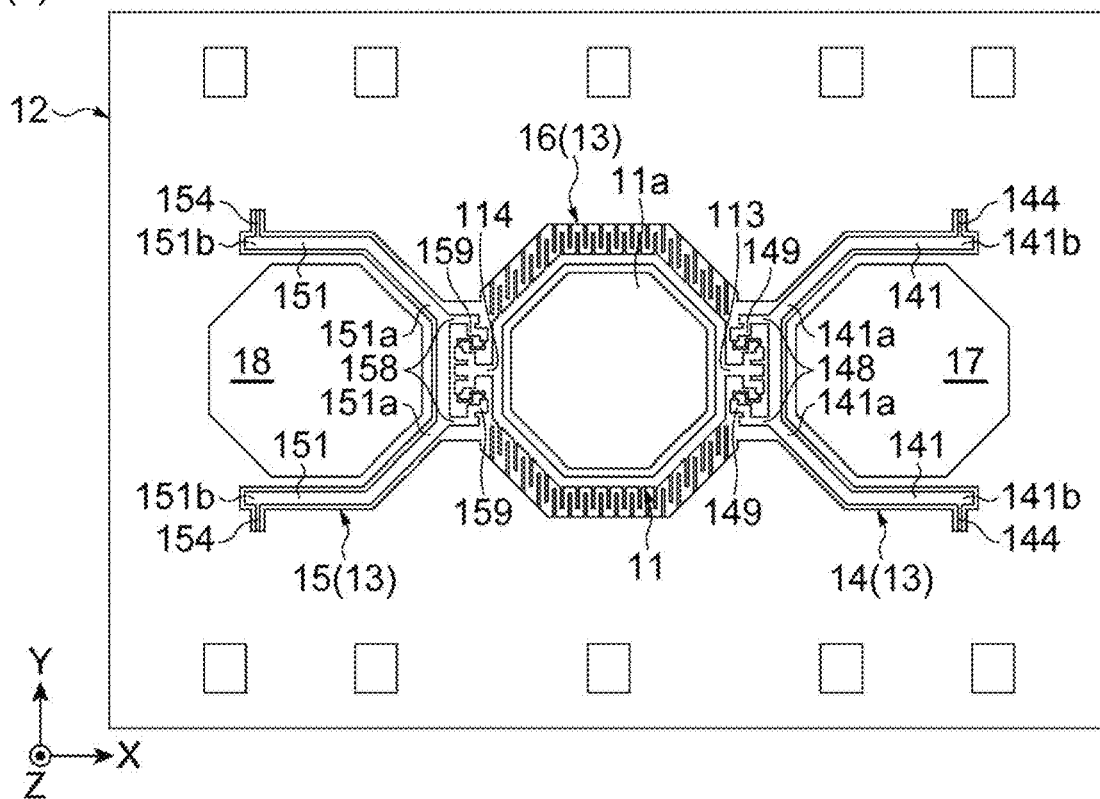

Fig.17
(a)
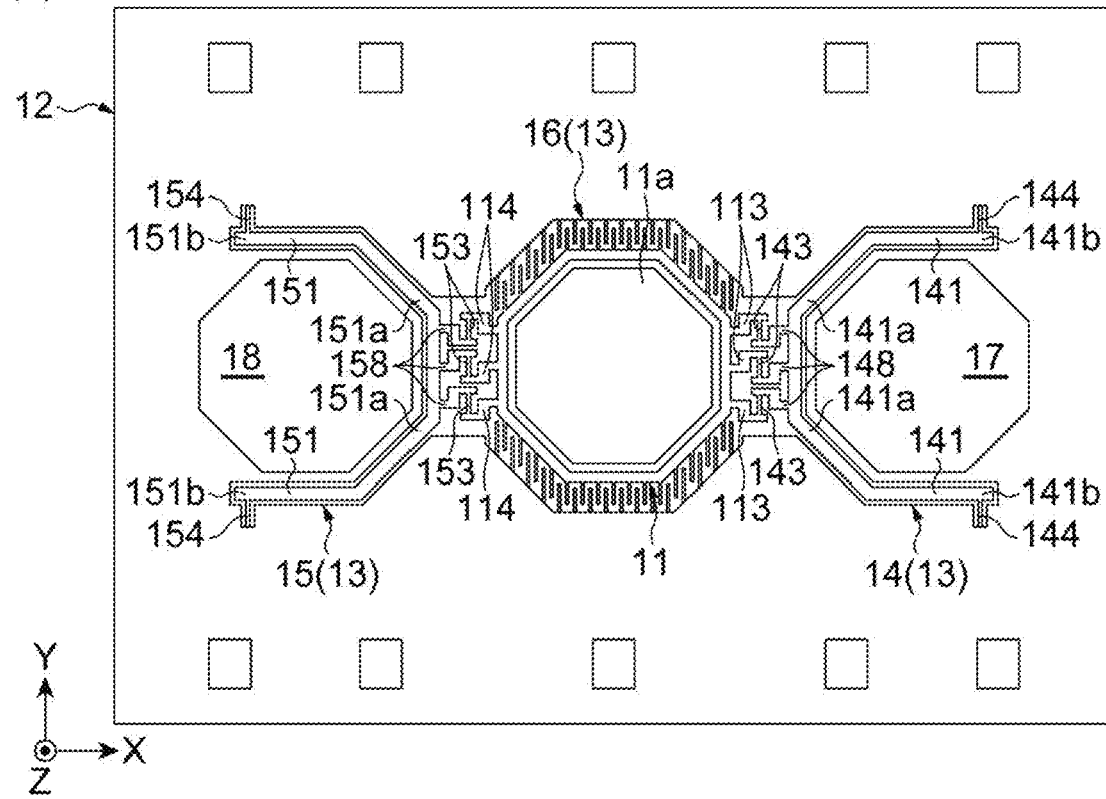
(b)
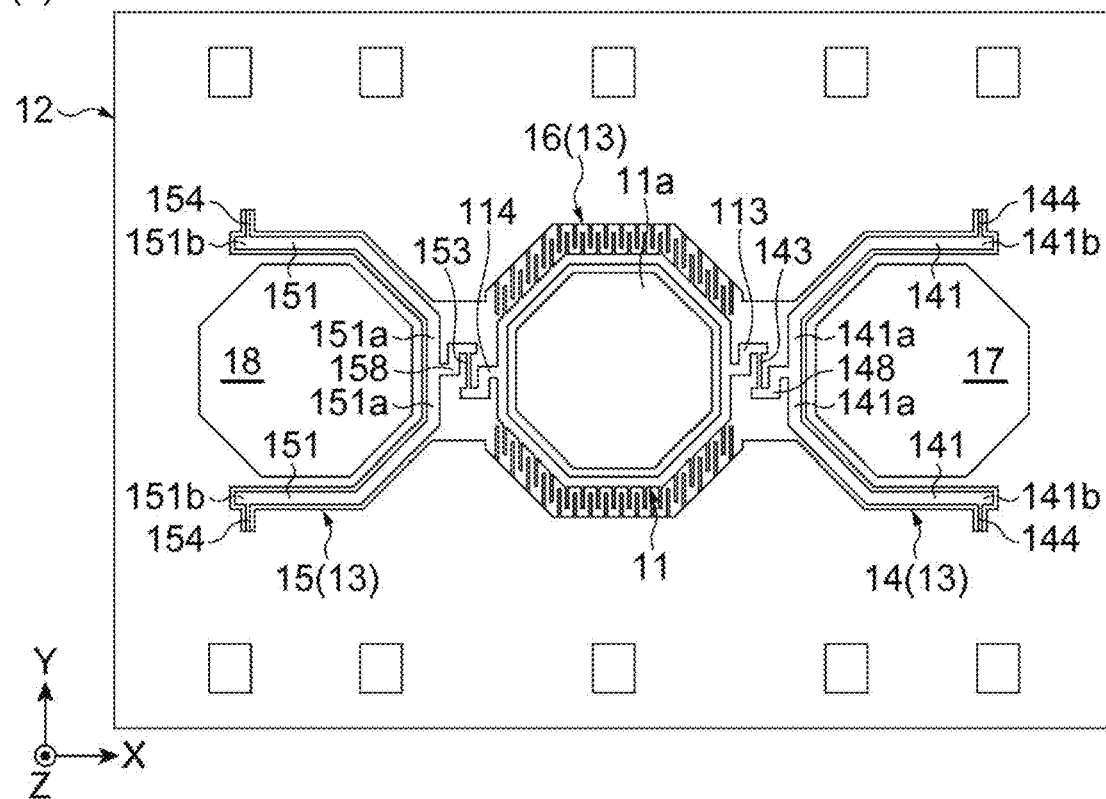

*Fig.18*
(a)
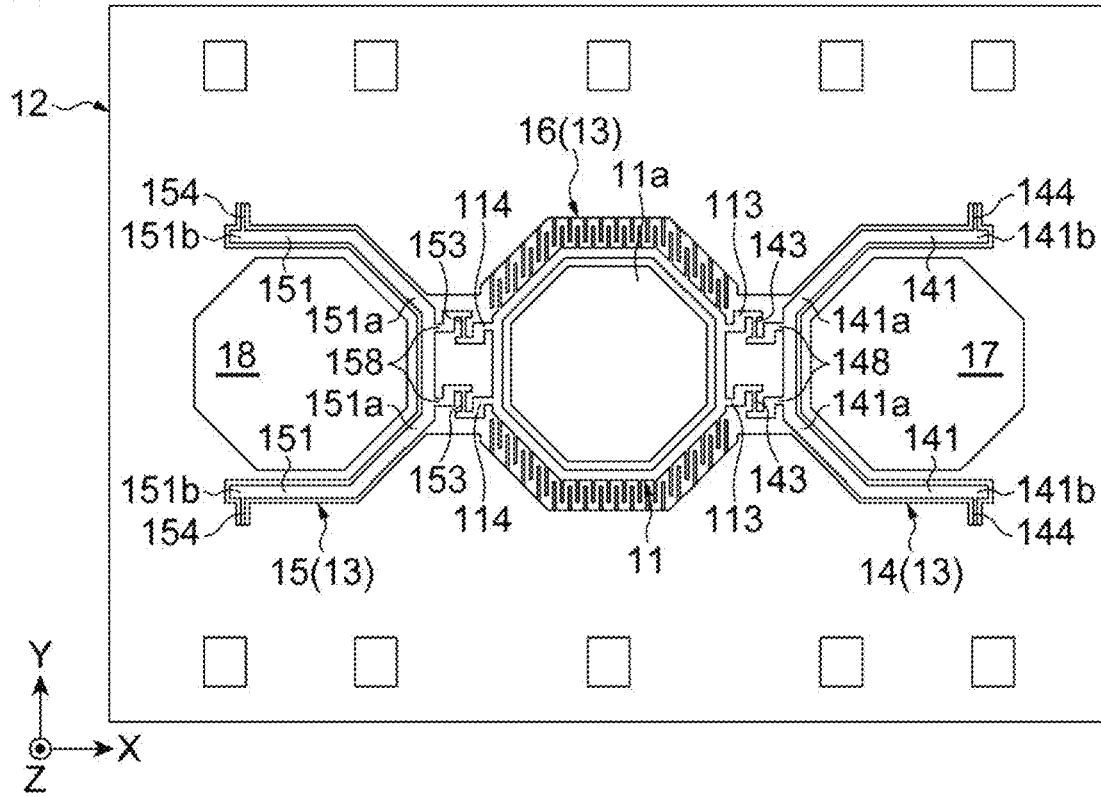
(b)
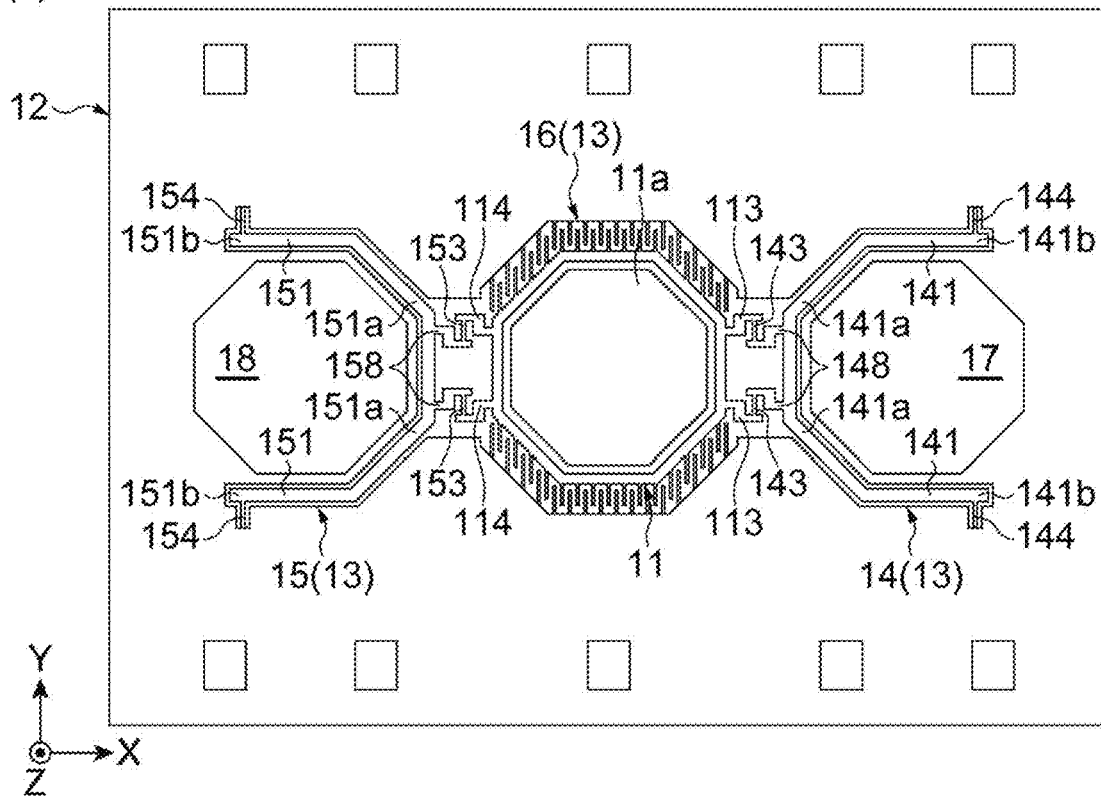

OPTICAL DEVICE INCLUDING MOVABLE MIRROR AND FIRST LIGHT PASSAGE

TECHNICAL FIELD

The present disclosure relates to an optical device.

BACKGROUND ART

An optical module in which an interference optical system is formed on a silicon on insulator (SOI) substrate by a micro electro mechanical systems (MEMS) technology is known (for example, see Patent Literature 1). Such an optical module is gaining attention in that this optical module can provide a Fourier transform infrared spectrometer (FTIR) realizing a highly accurate optical arrangement.

CITATION LIST

Patent Literature

Patent Literature 1: Japanese Unexamined Patent Publication No. 2012-524295

SUMMARY OF INVENTION

Technical Problem

However, the optical module as described above has the following problems, for example, in that the size of a mirror surface of a movable mirror is dependent on the level of deep drilling on the SOI substrate. That is, since the level of deep drilling on the SOI substrate is about 500 μm to maximum, there is a limitation in the improvement of the sensitivity of the FTIR due to an increase in the size of the mirror surface of the movable mirror. On the other hand, if the movable mirror increases in size as the mirror surface increases in size, there is concern that the movable performance of the movable mirror is deteriorated or the entire device increases in size when other optical function portions are provided.

An object of the present disclosure is to provide an optical device capable of suppressing deterioration in the movable performance of the movable mirror and an increase in the size of the entire device while enlarging the mirror surface of the movable mirror.

Solution to Problem

An optical device of an aspect of the present disclosure includes: a base which includes a main surface; a movable mirror which includes a mirror surface following a plane parallel to the main surface; a first elastic support portion and a second elastic support portion which are connected to the base and the movable mirror and support the movable mirror so as to be movable along a first direction perpendicular to the main surface; an actuator which moves the movable mirror along the first direction; and a first optical function portion which is disposed at one side of the movable mirror in a second direction perpendicular to the first direction when viewed from the first direction, in which the first elastic support portion includes a pair of first levers extending along the main surface from the movable mirror toward both sides of the first optical function portion in a third direction perpendicular to the first direction and the second direction, and in which a length of each of the pair of first levers in the second direction is larger than the shortest distance between an outer edge of the mirror surface and an edge of the first optical function portion.

In the optical device, the movable mirror includes a mirror surface following a plane parallel to the main surface of the base. Accordingly, it is possible to enlarge the mirror surface of the movable mirror. Further, the first elastic support portion includes a pair of first levers extending along the main surface from the movable mirror toward both sides of the first optical function portion and the length of each of the pair of first levers in the arrangement direction of the movable mirror and the first optical function portion is larger than the shortest distance between the outer edge of the mirror surface and the edge of the first optical function portion. Accordingly, since an increase in the distance between the movable mirror and the first optical function portion is suppressed, it is possible to suppress an increase in the size of the entire device. Further, since the length of each of the pair of first levers in the first elastic support portion is secured, it is possible to suppress deterioration in the movable performance of the movable mirror. As described above, according to the optical device, it is possible to suppress deterioration in the movable performance of the movable mirror and an increase in the size of the entire device while enlarging the mirror surface of the movable mirror.

In the optical device of an aspect of the present disclosure, a maximum distance between the pair of first levers in the third direction may be equal to or larger than a maximum width of the first optical function portion in the third direction. Accordingly, it is possible to realize the suppressing of an increase in the distance between the movable mirror and the first optical function portion and the securing of the length of each of the pair of first levers with a higher balance.

In the optical device of an aspect of the present disclosure, a distance from a portion closest to the mirror surface in the edge of the first optical function portion to an end portion at the side opposite to the movable mirror in each of the pair of first levers may be larger than a distance from a portion farthest from the mirror surface in the edge of the first optical function portion to the end portion at the side opposite to the movable mirror in each of the pair of first levers. Accordingly, it is possible to realize the suppressing of an increase in the distance between the movable mirror and the first optical function portion and the securing of the length of each of the pair of first levers.

In the optical device of an aspect of the present disclosure, the first elastic support portion may further include a pair of second levers extending along the main surface from both sides of the first optical function portion in the third direction toward the movable mirror, an end portion at the side of the movable mirror in each of the pair of first levers may be connected to the movable mirror through at least one torsion bar, an end portion at the side opposite to the movable mirror in each of the pair of first levers may be connected to an end portion at the side opposite to the movable mirror in each of the pair of second levers through at least one torsion bar, and an end portion at the side of the movable mirror in each of the pair of second levers may be connected to the base through at least one torsion bar. Accordingly, it is possible to increase the movable range of the movable mirror and to improve the movable efficiency of the movable mirror (to reduce the driving force necessary for driving the movable mirror).

In the optical device of an aspect of the present disclosure, an end portion at the side of the movable mirror in each of the pair of first levers may be connected to the movable mirror through at least one torsion bar and an end portion at the side opposite to the movable mirror in each of the pair of first levers may be connected to the base through at least one torsion bar. Accordingly, it is possible to simplify the structure of the first elastic support portion.

In the optical device of an aspect of the present disclosure, the end portion at the side of the movable mirror in each of the pair of first levers may be connected to the movable mirror through a plurality of torsion bars disposed on the same axis parallel to the third direction. Accordingly, it is possible to shorten the length of each of the plurality of torsion bars disposed on the same axis. As a result, it is possible to suppress the movement of the movable mirror in the second direction and the rotation of the movable mirror around the axis parallel to the first direction.

In the optical device of an aspect of the present disclosure, the actuator may include a comb electrode disposed along an outer edge of the movable mirror. Accordingly, it is possible to highly efficiently use an electrostatic force generated by the comb electrode as the driving force of the movable mirror.

In the optical device of an aspect of the present disclosure, the comb electrode may be separated from the outer edge of the movable mirror and the actuator may further include a connection portion connecting the comb electrode and the movable mirror to each other. Accordingly, for example, when the mirror surface is the surface of the metal layer, the attachment of the metal layer to the comb electrode can be prevented.

In the optical device of an aspect of the present disclosure, the movable mirror may include a main body provided with the mirror surface and a wall portion provided in the main body and surrounding the mirror surface when viewed from the first direction. Accordingly, since the wall portion functions as a rib, it is possible to suppress the deformation (warping, bending, or the like) of the mirror surface while thinning the main body.

In the optical device of an aspect of the present disclosure, the first optical function portion may be a light passage opening portion provided in the base. Accordingly, an optical element such as the fixed mirror can be disposed at a position overlapping the first optical function portion when viewed from the first direction perpendicular to the main surface of the base.

In the optical device of an aspect of the present disclosure, the first optical function portion may be a fixed mirror provided in the base. Accordingly, it is possible to realize the optical device including the movable mirror and the fixed mirror while suppressing an increase in the size of the entire device.

In the optical device of an aspect of the present disclosure, the base, the movable mirror, the actuator, the first elastic support portion, the second elastic support portion, and the first optical function portion may be configured by an SOI substrate. Accordingly, it is possible to obtain the optical device in which each configuration is easily and highly accurately formed by an MEMS technology.

The optical device of an aspect of the present disclosure may further include: a second optical function portion which is disposed at the other side of the movable mirror in the second direction when viewed from the first direction, the second elastic support portion may include a pair of third levers extending along the main surface from the movable mirror toward both sides of the second optical function portion in the third direction, and a length of each of the pair of third levers in the second direction may be larger than the shortest distance between the outer edge of the mirror surface and an edge of the second optical function portion. Accordingly, it is possible to suppress deterioration in the movable performance of the movable mirror and an increase in the size of the entire device while achieving multi-functionality of the device.

Advantageous Effects of Invention

According to the present disclosure, it is possible to provide an optical device capable of suppressing deterioration in the movable performance of the movable mirror and an increase in the size of the entire device while enlarging the mirror surface of the movable mirror.

BRIEF DESCRIPTION OF DRAWINGS

FIG. 4 is a diagram for describing a method of manufacturing the optical device illustrated in FIG. 2.

FIG. 5 is a diagram for describing a method of manufacturing the optical device illustrated in FIG. 2.

FIG. 6 is a diagram for describing a method of manufacturing the optical device illustrated in FIG. 2.

FIG. 8 is a diagram for describing a modified example of a method of manufacturing the optical device illustrated in FIG. 2.

FIG. 10 is a diagram for describing a modified example of a method of manufacturing the optical device illustrated in FIG. 2.

FIG. 11 is a diagram for describing a modified example of a method of manufacturing the optical device illustrated in FIG. 2.

FIG. 12 is a plan view of a modified example of the optical device.

FIG. 13 is a plan view of a modified example of the optical device.

FIG. 14 is a plan view of a modified example of the optical device.

FIG. 15 is a plan view of a modified example of the optical device.

FIG. 17 is a plan view of a modified example of the optical device.

FIG. 18 is a plan view of a modified example of the optical device.

DESCRIPTION OF EMBODIMENTS

Figure 1:
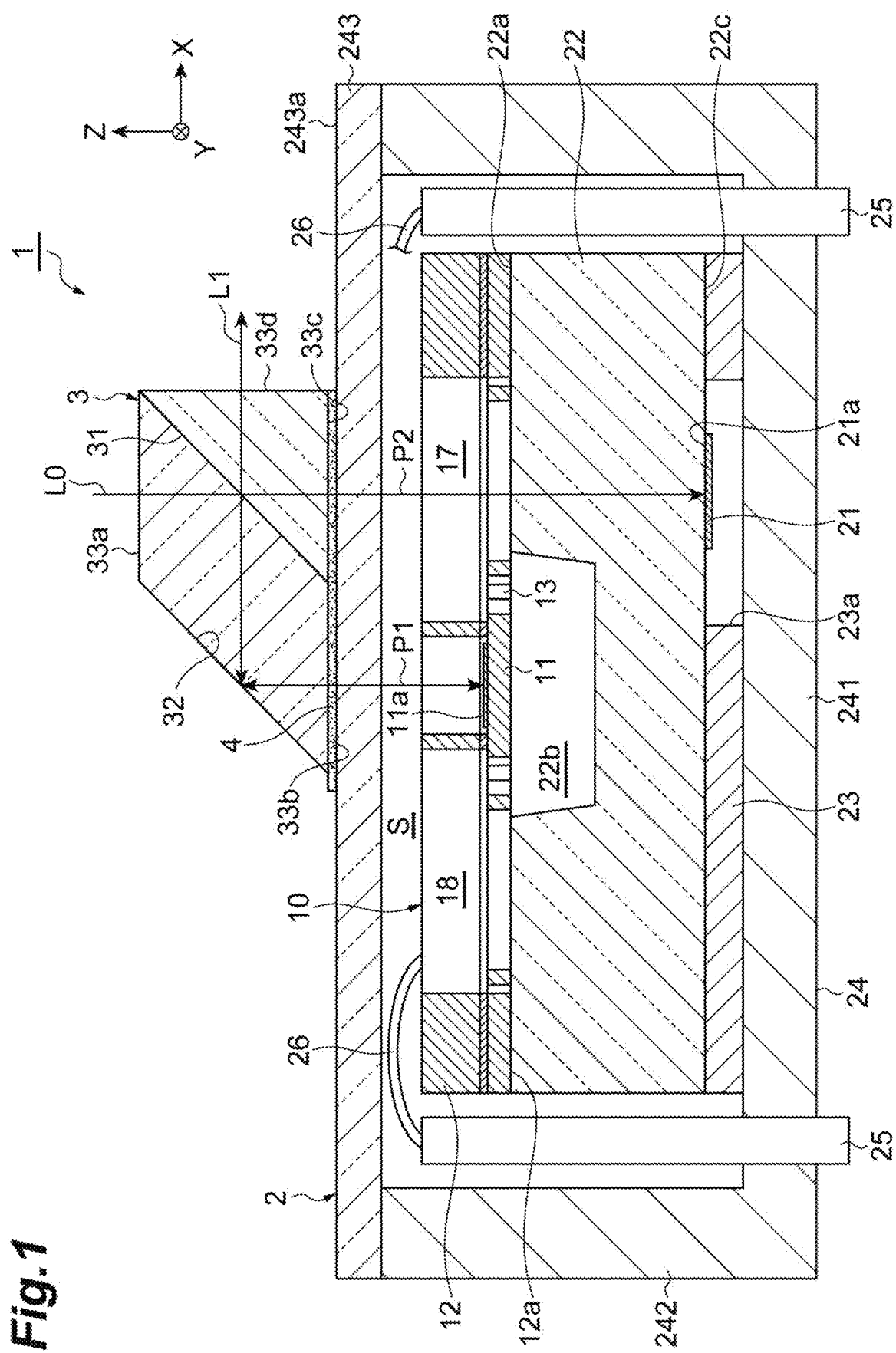
FIG. 1 is a longitudinal sectional view of an optical module of an embodiment.

Hereinafter, embodiments of the present disclosure will be described in detail with reference to the drawings. Furthermore, in the drawings, the same reference numerals will be given to the same or corresponding parts and a redundant description thereof will be omitted.

[Configuration of Optical Module]

As illustrated in FIG. 1, an optical module 1 includes a mirror unit 2 and a beam splitter unit 3. The mirror unit 2 includes an optical device 10 and a fixed mirror 21. The optical device 10 includes a movable mirror 11. In the optical module 1, the beam splitter unit 3, the movable mirror 11, and the fixed mirror 21 constitute an interference optical system for measurement light L0. Here, the interference optical system is a Michelson interference optical system.

The optical device 10 includes a base 12, a drive unit 13, a first optical function portion 17, and a second optical function portion 18 in addition to the movable mirror 11. The base 12 includes a main surface 12a. The movable mirror 11 includes a mirror surface 11a following a plane parallel to the main surface 12a. The movable mirror 11 is supported by the base 12 so as to be movable along a Z-axis direction perpendicular to the main surface 12a (a direction parallel to the Z axis, a first direction). The drive unit 13 moves the movable mirror 11 along the Z-axis direction. The first optical function portion 17 is disposed at one side of the movable mirror 11 in an X-axis direction perpendicular to the Z-axis direction (a direction parallel to the X axis, a second direction) when viewed from the Z-axis direction. The second optical function portion 18 is disposed at the other side of the movable mirror 11 in the X-axis direction when viewed from the Z-axis direction. The first optical function portion 17 and the second optical function portion 18 are respectively light passage opening portions provided in the base 12 and are opened to one side and the other side in the Z-axis direction.

The fixed mirror 21 includes a mirror surface 21a following a plane parallel to the main surface 12a. The position of the fixed mirror 21 with respect to the base 12 is fixed. In the mirror unit 2, the mirror surface 11a of the movable mirror 11 and the mirror surface 21a of the fixed mirror 21 face one side in the Z-axis direction (the side of the beam splitter unit 3).

The mirror unit 2 includes a support body 22, a sub-mount 23, and a package 24 in addition to the optical device 10 and the fixed mirror 21. The package 24 accommodates the optical device 10, the fixed mirror 21, the support body 22, and the sub-mount 23. The package 24 includes a bottom wall 241, a side wall 242, and a ceiling wall 243. The package 24 is formed in, for example, a rectangular parallelepiped box shape. The package 24 has, for example, a size of about 30×25×10 (thickness) mm. The bottom wall 241 and the side wall 242 are integrally formed with each other. The ceiling wall 243 faces the bottom wall 241 in the Z-axis direction and is fixed to the side wall 242. The ceiling wall 243 has optical transparency with respect to the measurement light L0. In the mirror unit 2, a space S is formed by the package 24. The space S is opened to the outside of the mirror unit 2 through, for example, a ventilation hole, a gap, or the like provided in the package 24. In this way, when the space S is not an airtight space, contamination, clouding, or the like of the mirror surface 11a caused by an out gas from the resin material present in the package 24, moisture present in the package 24, or the like can be suppressed. Additionally, the space S may be an airtight space in which a high degree of vacuum is maintained or an airtight space filled with an inert gas such as nitrogen.

The support body 22 is fixed to the inner surface of the bottom wall 241 through the sub-mount 23. The support body 22 is formed in, for example, a rectangular plate shape. The support body 22 has optical transparency with respect to the measurement light L0. The base 12 of the optical device 10 is fixed to a surface 22a at the side opposite to the sub-mount 23 in the support body 22. That is, the base 12 is supported by the support body 22. A concave portion 22b is formed on the surface 22a of the support body 22 and a gap (a part of the space S) is formed between the optical device 10 and the ceiling wall 243. Accordingly, the contact of the movable mirror 11 and the drive unit 13 with respect to the support body 22 and the ceiling wall 243 is prevented when the movable mirror 11 is moved along the Z-axis direction.

An opening 23a is formed in the sub-mount 23. The fixed mirror 21 is disposed on a surface 22c at the side of the sub-mount 23 in the support body 22 so as to be located within the opening 23a. That is, the fixed mirror 21 is disposed on the surface 22c at the side opposite to the base 12 in the support body 22. The fixed mirror 21 is disposed at one side of the movable mirror 11 in the X-axis direction when viewed from the Z-axis direction. The fixed mirror 21 overlaps the first optical function portion 17 of the optical device 10 when viewed from the Z-axis direction.

The mirror unit 2 further includes a plurality of lead pins 25 and a plurality of wires 26. Each lead pin 25 is fixed to the bottom wall 241 while penetrating the bottom wall 241. Each lead pin 25 is electrically connected to the drive unit 13 through a wire 26. In the mirror unit 2, an electric signal for moving the movable mirror 11 along the Z-axis direction is applied to the drive unit 13 through the plurality of lead pins 25 and the plurality of wires 26.

The beam splitter unit 3 is supported by the ceiling wall 243 of the package 24. Specifically, the beam splitter unit 3 is fixed to a surface 243a at the side opposite to the optical device 10 in the ceiling wall 243 by an optical resin 4. The optical resin 4 has optical transparency with respect to the measurement light L0.

The beam splitter unit 3 includes a half mirror surface 31, a total reflection mirror surface 32, and a plurality of optical surface 33a, 33b, 33c, and 33d. The beam splitter unit 3 is configured by bonding a plurality of optical blocks. The half mirror surface 31 is formed by, for example, a dielectric multilayer. The total reflection mirror surface 32 is formed by, for example, a metal film.

The optical surface 33a is, for example, a surface perpendicular to the Z-axis direction and overlaps the first optical function portion 17 of the optical device 10 and the mirror surface 21a of the fixed mirror 21 when viewed from the Z-axis direction. The measurement light L0 which is incident along the Z-axis direction is transmitted through the optical surface 33a.

The half mirror surface 31 is, for example, a surface inclined by 45° with respect to the optical surface 33a and overlaps the first optical function portion 17 of the optical device 10 and the mirror surface 21a of the fixed mirror 21 when viewed from the Z-axis direction. The half mirror surface 31 reflects a part of the measurement light L0, which is incident to the optical surface 33a along the Z-axis direction, along the X-axis direction and transmits the remaining part of the measurement light L0 toward the fixed mirror 21 along the Z-axis direction.

The total reflection mirror surface 32 is a surface parallel to the half mirror surface 31, overlaps the mirror surface 11a of the movable mirror 11 when viewed from the Z-axis direction, and overlaps the half mirror surface 31 when viewed from the X-axis direction. The total reflection mirror surface 32 reflects a part of the measurement light L0 reflected by the half mirror surface 31 toward the movable mirror 11 along the Z-axis direction.

The optical surface 33b is a surface parallel to the optical surface 33a and overlaps the mirror surface 11a of the movable mirror 11 when viewed from the Z-axis direction. The optical surface 33b transmits a part of the measurement light L0 reflected by the total reflection mirror surface 32 toward the movable mirror 11 along the Z-axis direction.

The optical surface 33c is a surface parallel to the optical surface 33a and overlaps the mirror surface 21a of the fixed mirror 21 when viewed from the Z-axis direction. The optical surface 33c transmits the remaining part of the measurement light L0 transmitted through the half mirror surface 31 toward the fixed mirror 21 along the Z-axis direction.

The optical surface 33d is, for example, a surface perpendicular to the X-axis direction and overlaps the half mirror surface 31 and the total reflection mirror surface 32 when viewed from the X-axis direction. The optical surface 33d transmits the measurement light L1 along the X-axis direction. The measurement light L1 is the interference light of a part of the measurement light L0 sequentially reflected by the mirror surface 11a of the movable mirror 11 and the total reflection mirror surface 32 and transmitted through the half mirror surface 31 and the remaining part of the measurement light L0 sequentially reflected by the mirror surface 21a of the fixed mirror 21 and the half mirror surface 31.

In the optical module 1 with the above-described configuration, when the measurement light L0 is incident from the outside of the optical module 1 to the beam splitter unit 3 through the optical surface 33a, a part of the measurement light L0 is sequentially reflected by the half mirror surface 31 and the total reflection mirror surface 32 and travels toward the mirror surface 11a of the movable mirror 11. Then, a part of the measurement light L0 is reflected by the mirror surface 11a of the movable mirror 11, travels in the reverse direction on the same optical path (an optical path P1 to be described later), and is transmitted through the half mirror surface 31 of the beam splitter unit 3.

Meanwhile, the remaining part of the measurement light L0 is transmitted through the half mirror surface 31 of the beam splitter unit 3, passes through the first optical function portion 17, is further transmitted through the support body 22, and travels toward the mirror surface 21a of the fixed mirror 21. Then, the remaining part of the measurement light L0 is reflected by the mirror surface 21a of the fixed mirror 21, travels in the reverse direction on the same optical path (an optical path P2 to be described later), and is reflected by the half mirror surface 31 of the beam splitter unit 3.

A part of the measurement light L0 transmitted through the half mirror surface 31 of the beam splitter unit 3 and the remaining part of the measurement light L0 reflected by the half mirror surface 31 of the beam splitter unit 3 become the measurement light L1 that is the interference light and the measurement light L1 is emitted from the beam splitter unit 3 to the outside of the optical module 1 through the optical surface 33d. According to the optical module 1, since it is possible to reciprocate the movable mirror 11 at a high speed along the Z-axis direction, a small and highly accurate FTIR can be provided.

The support body 22 corrects an optical path difference between an optical path P1 between the beam splitter unit 3 and the movable mirror 11 and an optical path P2 between the beam splitter unit 3 and the fixed mirror 21. Specifically, the optical path P1 is an optical path extending from the half mirror surface 31 to the mirror surface 11a of the movable mirror 11 located at the reference position through the total reflection mirror surface 32 and the optical surface 33b in a sequential order and is an optical path along which a part of the measurement light L0 travels. The optical path P2 is an optical path extending from the half mirror surface 31 to the mirror surface 21a of the fixed mirror 21 through the optical surface 33c and the first optical function portion 17 in a sequential order and is an optical path along which the remaining part of the measurement light L0 travels. The support body 22 corrects the optical path difference between the optical path P1 and the optical path P2 so that a difference between the optical path length of the optical path P1 (the optical path length considering the refractive index of each medium through which the optical path P1 passes) and the optical path length of the optical path P2 (the optical path length considering the refractive index of each medium through which the optical path P2 passes) decreases. Furthermore, the support body 22 can be formed of, for example, a material having the same optical transparency as that of each of the optical blocks constituting the beam splitter unit 3. In this case, the thickness (the length in the Z-axis direction) of the support body 22 can be the same as the distance between the half mirror surface 31 and the total reflection mirror surface 32 in the X-axis direction.

[Configuration of Optical Device]

Figure 2:
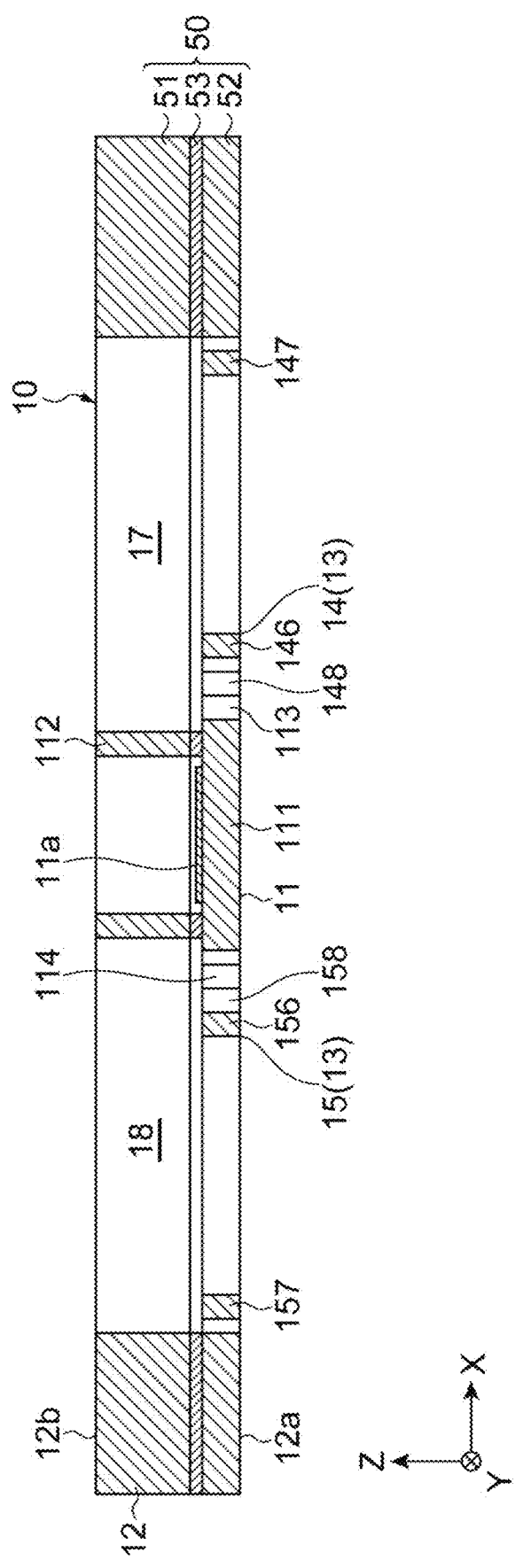
FIG. 2 is a longitudinal sectional view of an optical device included in the optical module illustrated in FIG. 1.
Figure 3:
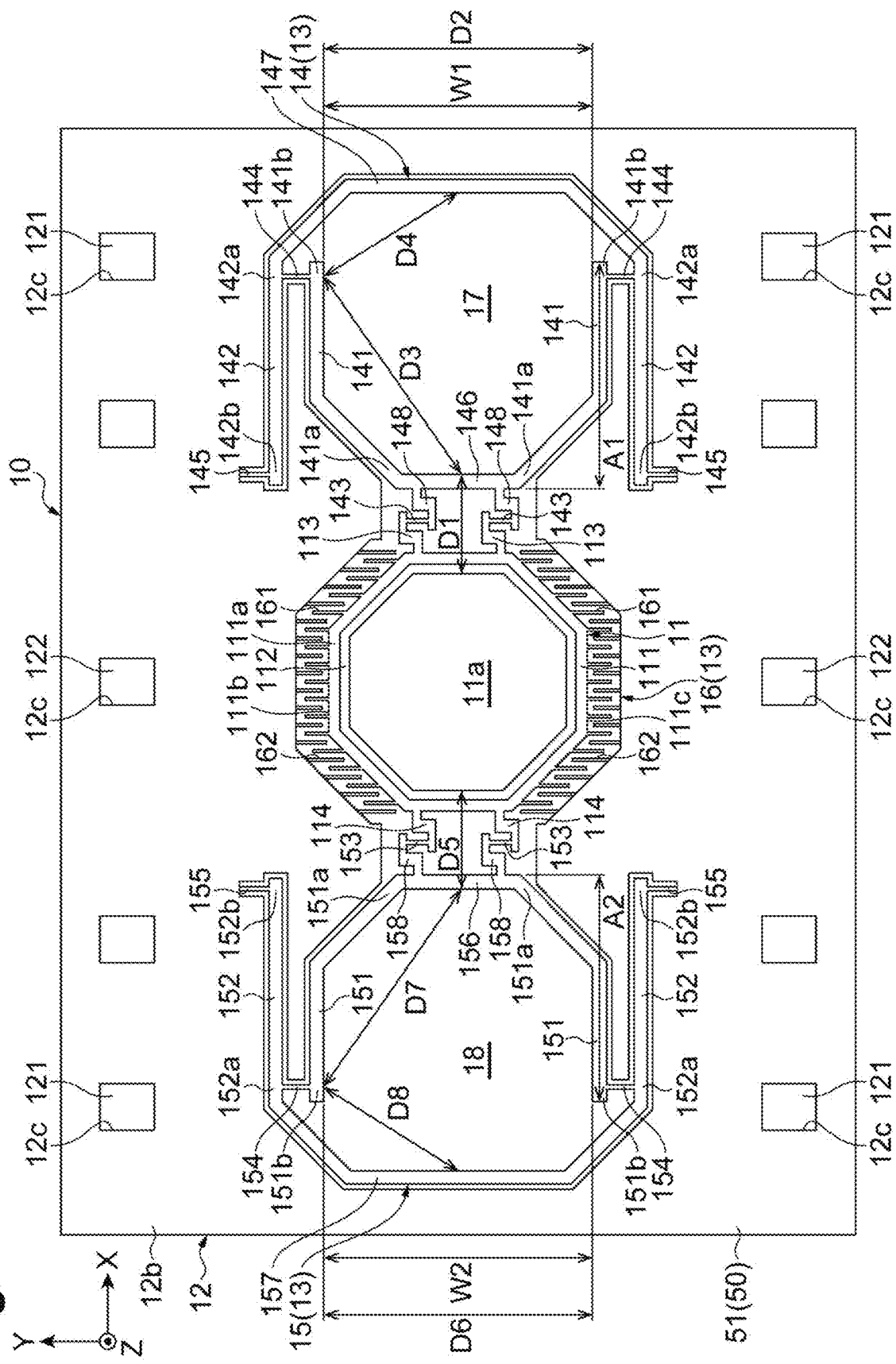
FIG. 3 is a plan view of the optical device illustrated in FIG. 2.

As illustrated in FIGS. 2 and 3, the base 12, the movable portion of the movable mirror 11, the drive unit 13, the first optical function portion 17, and the second optical function portion 18 are configured by an SOI substrate 50. That is, the optical device 10 is formed by the SOI substrate 50. The optical device 10 is formed in, for example, a rectangular plate shape. The optical device 10 has, for example, a size of about 15×10×0.3 (thickness) mm. The SOI substrate 50 includes a support layer 51, a device layer 52, and an intermediate layer 53. Specifically, the support layer 51 is a first silicon layer of the SOI substrate 50. The device layer 52 is a second silicon layer of the SOI substrate 50. The intermediate layer 53 is an insulation layer of the SOI substrate 50 and is disposed between the support layer 51 and the device layer 52. The movable mirror 11 and the drive unit 13 are integrally formed in a part of the device layer 52 by an MEMS technology (patterning and etching).

The base 12 is formed by the support layer 51, the device layer 52, and the intermediate layer 53. The main surface 12a of the base 12 is a surface at the side opposite to the intermediate layer 53 in the device layer 52. A main surface 12b facing the main surface 12a in the base 12 is a surface at the side opposite to the intermediate layer 53 in the support layer 51. In the optical module 1, the main surface 12a of the base 12 is bonded to the surface 22a of the support body 22 (see FIG. 1).

The movable mirror 11 includes a main body 111 and a wall portion 112 that are movable portions. The main body 111 is formed by the device layer 52. The mirror surface 11a is provided in a surface 111a at the side of the main surface 12b in the main body 111 by forming a metal film. The wall portion 112 is formed by the support layer 51 and the intermediate layer 53. The wall portion 112 is provided in the surface 111a of the main body 111. The wall portion 112 surrounds the mirror surface 11a when viewed from the Z-axis direction. As an example, the wall portion 112 is provided in the surface 111a of the main body 111 so as to follow the outer edge inside the outer edge of the main body 111 when viewed from the Z-axis direction and to follow the outer edge at the outside of the outer edge of the mirror surface 11a when viewed from the Z-axis direction.

The movable mirror 11 further includes a pair of brackets 113 and a pair of brackets 114 that are movable portions. The pair of brackets 113 and the pair of brackets 114 are formed by the device layer 52. The pair of brackets 113 is provided in a region at the side of the first optical function portion 17 in the side surface of the main body 111 so as to protrude toward the first optical function portion 17. Each bracket 113 is bent in a crank shape to the same side when viewed from the Z-axis direction. The pair of brackets 114 is provided in a region at the side of the second optical function portion 18 in the side surface of the main body 111 so as to protrude toward the second optical function portion 18 (the side opposite to the first optical function portion 17). Each bracket 114 is bent in a crank shape to the same side (here, the side opposite to each bracket 113) when viewed from the Z-axis direction.

The drive unit 13 includes a first elastic support portion 14, a second elastic support portion 15, and an actuator 16. The first elastic support portion 14, the second elastic support portion 15, and the actuator 16 are formed by the device layer 52.

The first elastic support portion 14 and the second elastic support portion 15 are connected to the base 12 and the movable mirror 11. The first elastic support portion 14 and the second elastic support portion 15 support the movable mirror 11 so as to be movable along the Z-axis direction.

The first elastic support portion 14 includes a pair of first levers 141, a pair of second levers 142, a plurality of torsion bars 143, 144, and 145, a plurality of links 146 and 147, and a pair of brackets 148. The pair of first levers 141 extends along the main surface 12a of the base 12 from the movable mirror 11 toward both sides of the first optical function portion 17 in a Y-axis direction perpendicular to the Z-axis direction and the X-axis direction (a direction parallel to the Y axis, a third direction). In this embodiment, the pair of first levers 141 extends along the main surface 12a of the base 12 from a gap between the movable mirror 11 and the first optical function portion 17 toward both sides of the first optical function portion 17 in the Y-axis direction. The pair of first levers 141 extends along the edge of the first optical function portion 17 when viewed from the Z-axis direction. The pair of second levers 142 extends along the main surface 12a of the base 12 from both sides of the first optical function portion 17 in the Y-axis direction toward the movable mirror 11. The pair of second levers 142 extends along the X-axis direction outside the pair of first levers 141 when viewed from the Z-axis direction.

The link 146 is laid between end portions 141a at the side of the movable mirror 11 in the first levers 141. The link 147 is laid between end portions 142a at the side opposite to the movable mirror 11 in the second levers 142. Each of the links 146 and 147 extends along the edge of the first optical function portion 17 when viewed from the Z-axis direction. The pair of brackets 148 is provided in a side surface at the side of the movable mirror 11 in the link 146 so as to protrude toward the movable mirror 11. Each bracket 148 is bent in a crank shape to the same side (here, the side opposite to each bracket 113) when viewed from the Z-axis direction. The front end portion of one bracket 148 faces the front end portion of one bracket 113 in the Y-axis direction. The front end portion of the other bracket 148 faces the front end portion of the other bracket 113 in the Y-axis direction.

The torsion bar 143 is laid between the front end portion of one bracket 148 and the front end portion of one bracket 113 and between the front end portion of the other bracket 148 and the front end portion of the other bracket 113. The torsion bar 143 is laid between the bracket 148 and the bracket 113 which are bent in a crank shape to the opposite side. That is, the end portion 141a of each first lever 141 is connected to the movable mirror 11 through the pair of torsion bars 143. The pair of torsion bars 143 is disposed on the same axis parallel to the Y-axis direction.

The torsion bar 144 is laid between the end portion 142a of one second lever 142 and an end portion 141b at the side opposite to the movable mirror 11 in one first lever 141 and between the end portion 142a of the other second lever 142 and the end portion 141b at the side opposite to the movable mirror 11 in the other first lever 141. That is, the end portion 141b of each first lever 141 is connected to the end portion 142a of each second lever 142 through the pair of torsion bars 144. The pair of torsion bars 144 is disposed on the same axis parallel to the Y-axis direction.

The torsion bar 145 is laid between the base 12 and an end portion 142b at the side of the movable mirror 11 in one second lever 142 and between the base 12 and the end portion 142b at the side of the movable mirror 11 in the other second lever 142. That is, the end portion 142b of each second lever 142 is connected to the base 12 through the pair of torsion bars 145. The pair of torsion bars 145 is disposed on the same axis parallel to the Y-axis direction.

The second elastic support portion 15 includes a pair of third levers 151, a pair of fourth levers 152, a plurality of torsion bars 153, 154, and 155, a plurality of links 156 and 157, and a pair of brackets 158. The pair of third levers 151 extends along the main surface 12a of the base 12 from the movable mirror 11 toward both sides of the second optical function portion 18 in the Y-axis direction. In this embodiment, the pair of third levers 151 extends from a gap between the movable mirror 11 and the second optical function portion 18 toward both sides of the second optical function portion 18 in the Y-axis direction. The pair of third levers 151 extends along the edge of the second optical function portion 18 when viewed from the Z-axis direction. The pair of fourth levers 152 extends along the main surface 12a of the base 12 from both sides of the second optical function portion 18 in the Y-axis direction toward the movable mirror 11. The pair of fourth levers 152 extends along the X-axis direction outside the pair of third levers 151 when viewed from the Z-axis direction.

The link 156 is laid between end portions 151a at the side of the movable mirror 11 in the third levers 151. The link 157 is laid between end portions 152a at the side opposite to the movable mirror 11 in the fourth levers 152. Each of the links 156 and 157 extends along the edge of the second optical function portion 18 when viewed from the Z-axis direction. The pair of brackets 158 is provided in a side surface at the side of the movable mirror 11 in the link 156 so as to protrude toward the movable mirror 11. Each bracket 158 is bent in a crank shape to the same side (here, the side opposite to each bracket 114) when viewed from the Z-axis direction. The front end portion of one bracket 158 faces the front end portion of one bracket 114 in the Y-axis direction. The front end portion of the other bracket 158 faces the front end portion of the other bracket 114 in the Y-axis direction.

The torsion bar 153 is laid between the front end portion of one bracket 158 and the front end portion of one bracket 114 and between the front end portion of the other bracket 158 and the front end portion of the other bracket 114. The torsion bar 153 is laid between the bracket 158 and the bracket 114 which are bent in a crank shape to the opposite side. That is, the end portions 151a of the third levers 151 are connected to the movable mirror 11 through the pair of torsion bars 153. The pair of torsion bars 153 is disposed on the same axis parallel to the Y-axis direction.

The torsion bar 154 is laid between the end portion 152a of one fourth lever 152 and an end portion 151b at the side opposite to the movable mirror 11 in one third lever 151 and between the end portion 152a of the other fourth lever 152 and the end portion 151b at the side opposite to the movable mirror 11 in the other third lever 151. That is, the end portion 151b of each third lever 151 is connected to the end portion 152a of each fourth lever 152 through the pair of torsion bars 154. The pair of torsion bars 154 is disposed on the same axis parallel to the Y-axis direction.

The torsion bar 155 is laid between the base 12 and an end portion 152b at the side of the movable mirror 11 in one fourth lever 152 and between the base 12 and the end portion 152b at the side of the movable mirror 11 in the other fourth lever 152. That is, the end portion 152b of each fourth lever 152 is connected to the base 12 through the pair of torsion bars 155. The pair of torsion bars 155 is disposed on the same axis parallel to the Y-axis direction.

The first optical function portion 17 is defined by at least the pair of first levers 141 and the plurality of links 146 and 147. In the first elastic support portion 14, a length A1 of each first lever 141 in the X-axis direction (a length of a portion extending to both sides of the first optical function portion 17 and for example, a length of a portion overlapping the first optical function portion 17 when viewed from the Y-axis direction) is larger than the shortest distance D1 between the outer edge of the mirror surface 11a and the edge of the first optical function portion 17 (the shortest distance when viewed from the Z-axis direction). A maximum distance D2 between the pair of first levers 141 in the Y-axis direction is the same as a maximum width W1 of the first optical function portion 17 in the Y-axis direction (the maximum width when viewed from the Z-axis direction). A distance D3 from a portion closest to the mirror surface 11a in the edge of the first optical function portion 17 to the end portion 141b of each first lever 141 (the distance when viewed from the Z-axis direction) is larger than a distance D4 from a portion farthest from the mirror surface 11a in the edge of the first optical function portion 17 to the end portion 141b of each first lever 141 (the distance when viewed from the Z-axis direction).

The second optical function portion 18 is defined by at least the pair of third levers 151 and the plurality of links 156 and 157. In the second elastic support portion 15, a length A2 of each third lever 151 in the X-axis direction (a length of a portion extending to both sides of the second optical function portion 18 and for example, a length of a portion overlapping the second optical function portion 18 when viewed from the Y-axis direction) is larger than the shortest distance D5 between the outer edge of the mirror surface 11a and the edge of the second optical function portion 18 (the shortest distance when viewed from the Z-axis direction). A maximum distance D6 between the pair of third levers 151 in the Y-axis direction is the same as a maximum width W2 of the second optical function portion 18 in the Y-axis direction (the maximum width when viewed from the Z-axis direction). A distance D7 from a portion closest to the mirror surface 11a in the edge of the second optical function portion 18 to the end portion 151b of each third lever 151 (the distance when viewed from the Z-axis direction) is larger than a distance D8 from a portion farthest from the mirror surface 11a in the edge of the second optical function portion 18 to the end portion 151b of each third lever 151 (the distance when viewed from the Z-axis direction).

The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction. Here, a portion excluding the pair of brackets 148 in the first elastic support portion 14 and a portion excluding the pair of brackets 158 in the second elastic support portion 15 have a symmetrical structure with respect to a plane passing through the center of the movable mirror 11 and perpendicular to the X-axis direction and a plane passing through the center of the movable mirror 11 and perpendicular to the Y-axis direction.

The actuator 16 moves the movable mirror 11 along the Z-axis direction. The actuator 16 includes a pair of comb electrodes 161 and a pair of comb electrodes 162 disposed along the outer edge of the movable mirror 11. One comb electrode 161 is provided in a region 111b between one bracket 113 and one bracket 114 in the side surface of the main body 111 of the movable mirror 11. The other comb electrode 161 is provided in a region 111c between the other bracket 113 and the other bracket 114 in the side surface of the main body 111 of the movable mirror 11. One comb electrode 162 is provided in a region extending along the region 111b while being separated from the region 111b of the main body 111 in the side surface of the device layer 52 of the base 12. The other comb electrode 162 is provided in a region extending along the region 111c while being separated from the region 111c of the main body 111 in the side surface of the device layer 52 of the base 12. In one comb electrode 161 and one comb electrode 162, each comb finger of one comb electrode 161 is located between respective comb fingers of one comb electrode 162. In the other comb electrode 161 and the other comb electrode 162, each comb finger of the other comb electrode 161 is located between respective comb fingers of the other comb electrode 162.

The base 12 is provided with a plurality of electrode pads 121 and 122. Each of the electrode pads 121 and 122 is formed on the surface of the device layer 52 inside an opening 12c formed in the main surface 12b of the base 12 so as to reach the device layer 52. Each electrode pad 121 is electrically connected to the comb electrode 161 through the first elastic support portion 14 and the main body 111 of the movable mirror 11 or the second elastic support portion 15 and the main body 111 of the movable mirror 11. Each electrode pad 122 is electrically connected to the comb electrode 162 through the device layer 52. The wire 26 is laid between each of the electrode pads 121 and 122 and each lead pin 25.

In the optical device 10 with the above-described configuration, when a voltage is applied across the plurality of electrode pads 121 and the plurality of electrode pads 122 through the plurality of lead pins 25 and the plurality of wires 26, for example, an electrostatic force is generated between the comb electrode 161 and the comb electrode 162 facing each other so that the movable mirror 11 is moved to one side in the Z-axis direction. At this time, the torsion bars 143, 144, 145, 153, 154, and 155 are twisted in the first elastic support portion 14 and the second elastic support portion 15 so that an elastic force is generated in the first elastic support portion 14 and the second elastic support portion 15. In the optical device 10, when a periodic electrical signal is applied to the drive unit 13 through the plurality of lead pins 25 and the plurality of wires 26, the movable mirror 11 can be reciprocated along the Z-axis direction at the resonance frequency level. In this way, the drive unit 13 functions as an electrostatic actuator.

[Optical Device Manufacturing Method]

An example of a method of manufacturing the optical device 10 will be described with reference to FIGS. 4 to 7. FIGS. 4 to 7 illustrate respective configurations along a plane (see FIG. 3) passing through the center of the movable mirror 11 and perpendicular to the X-axis direction.

First, as illustrated in (a) of FIG. 4, the SOI substrate 50 is prepared. Subsequently, an etching is performed on a surface at the side opposite to the intermediate layer 53 in the support layer 51 through a mask subjected to a predetermined patterning so as to remove a predetermined region in the support layer 51 and the intermediate layer 53 as illustrated in (b) of FIG. 4. The predetermined region is a region corresponding to the movable mirror 11, the drive unit 13, the first optical function portion 17, the second optical function portion 18, and the plurality of openings 12c (see FIG. 3). By the removal of the predetermined region, the wall portion 112, the pair of openings 12c, and the like of the movable mirror 11 are formed. (b) of FIG. 4 illustrates the wall portion 112 and the pair of openings 12c of the movable mirror 11.

Subsequently, as illustrated in (a) of FIG. 5, a hard mask 80 is bonded to a surface at the side opposite to the intermediate layer 53 in the support layer 51. The hard mask 80 is provided with a plurality of through-holes 80a. The plurality of through-holes 80a are formed in the hard mask 80 so as to correspond to the plurality of openings 12c. That is, the plurality of through-holes 80a are formed in the hard mask 80 so that one opening 12c communicates with one through-hole 80a. Such a hard mask 80 can be formed of, for example, silicon. Subsequently, as illustrated in (b) of FIG. 5, metal is deposited through the hard mask 80 so that a plurality of electrode pads 121 and 122 are formed on the surface of the device layer 52 inside the plurality of openings 12c (see FIG. 3).

Subsequently, the hard mask 80 is separated and a hard mask 90 is bonded to a surface at the side opposite to the intermediate layer 53 in the support layer 51 as illustrated in (a) of FIG. 6. The hard mask 90 is provided with a through-hole 90a. The through-hole 90a is formed in the hard mask 90 so as to correspond to the opening of the wall portion 112 of the movable mirror 11. That is, the through-hole 90a is formed in the hard mask 90 so that the opening of the wall portion 112 communicates with the through-hole 90a. Such a hard mask 90 can be formed of, for example, silicon. Subsequently, as illustrated in (b) of FIG. 6, metal is deposited through the hard mask 90 so that the mirror surface 11a which is a surface of a metal film is formed on the surface of the device layer 52 inside the opening of the wall portion 112 of the movable mirror 11.

Figure 7:
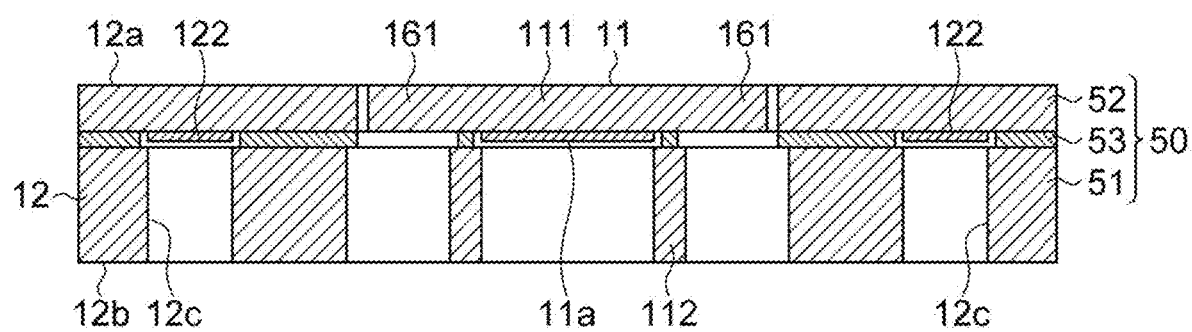
FIG. 7 is a diagram for describing a method of manufacturing the optical device illustrated in FIG. 2.

Subsequently, the hard mask 90 is separated and an etching is performed on a surface at the side opposite to the intermediate layer 53 in the device layer 52 through a mask subjected to a predetermined patterning so as to remove a predetermined region of the device layer 52 as illustrated in FIG. 7. Accordingly, the movable mirror 11, the drive unit 13, the first optical function portion 17, and the second optical function portion 18 are formed (see FIG. 3).

As described above, the optical device 10 can be obtained. Additionally, the optical device 10 is manufactured at the wafer level and dicing is finally performed so as to obtain a plurality of optical devices 10 at the same time. In the method of manufacturing the optical device 10, the mirror surface 11a is formed after forming the electrode pads 121 and 122, but the electrode pads 121 and 122 may be formed after forming the mirror surface 11a.

Next, a modified example of the method of manufacturing the optical device 10 will be described with reference to FIGS. 8 to 11. FIGS. 8 to 11 illustrate respective configurations in a cross-section passing through the center of the movable mirror 11 and perpendicular to the X-axis direction (see FIG. 3).

First, as illustrated in (a) of FIG. 8, the SOI substrate 50 is prepared. Subsequently, etching is performed on a surface at the side opposite to the intermediate layer 53 in the device layer 52 through a mask subjected to a predetermined patterning so as to remove a predetermined region of the device layer 52 as illustrated in (b) of FIG. 8. Accordingly, the movable mirror 11, the drive unit 13, the first optical function portion 17, and the second optical function portion 18 are formed (see FIG. 3). (b) of FIG. 8 illustrates the main body 111 of the movable mirror 11.

Figure 9:
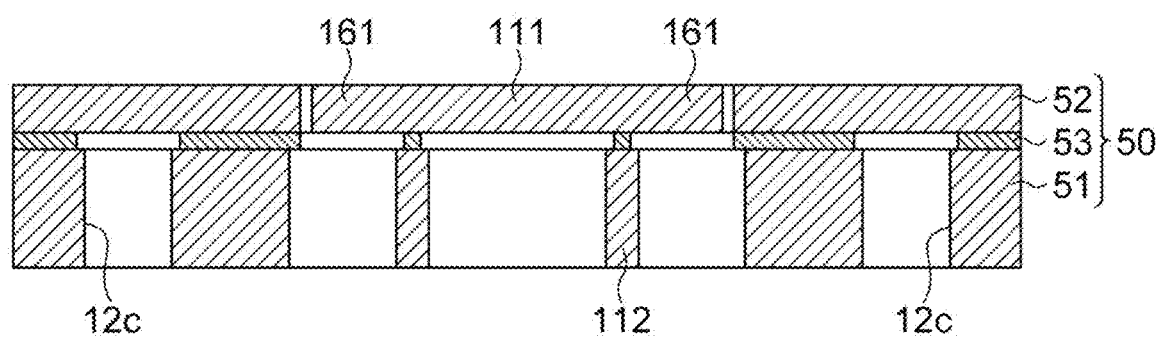
FIG. 9 is a diagram for describing a modified example of a method of manufacturing the optical device illustrated in FIG. 2.

Subsequently, an etching is performed on a surface at the side opposite to the intermediate layer 53 in the support layer 51 through a mask subjected to a predetermined patterning so as to remove a predetermined region of the support layer 51 and the intermediate layer 53 as illustrated in FIG. 9. The predetermined region is a region corresponding to the movable mirror 11, the drive unit 13, the first optical function portion 17, the second optical function portion 18, and the plurality of openings 12c (see FIG. 3). By the removal of the predetermined region, the wall portion 112, the pair of openings 12c, and the like of the movable mirror 11 are formed. FIG. 9 illustrates the wall portion 112 and the pair of openings 12c of the movable mirror 11.

Subsequently, as illustrated in (a) of FIG. 10, the hard mask 80 is bonded to a surface at the side opposite to the intermediate layer 53 in the support layer 51. The hard mask 80 is provided with the plurality of through-holes 80a. The plurality of through-holes 80a are formed in the hard mask 80 so as to correspond to the plurality of openings 12c. That is, the plurality of through-holes 80a are formed in the hard mask 80 so that one opening 12c communicates with one through-hole 80a. Such a hard mask 80 can be formed of, for example, silicon. Subsequently, as illustrated in (b) of FIG. 10, metal is deposited through the hard mask 80 so as to form the plurality of electrode pads 121 and 122 on the surface of the device layer 52 inside the plurality of openings 12c (see FIG. 3).

Subsequently, the hard mask 80 is separated and the hard mask 90 is bonded to a surface at the side opposite to the intermediate layer 53 in the support layer 51 as illustrated in (a) of FIG. 11. The hard mask 90 is provided with the through-hole 90a. The though-hole 90a is formed in the hard mask 90 so as to correspond to the opening of the wall portion 112 of the movable mirror 11. That is, the through-hole 90a is formed in the hard mask 90 so that the opening of the wall portion 112 communicates with the through-hole 90a. Such a hard mask 90 can be formed of, for example, silicon. Subsequently, as illustrated in (b) of FIG. 11, metal is deposited through the hard mask 90 so as to form the mirror surface 11a which is a surface of a metal film on the surface of the device layer 52 inside the opening of the wall portion 112 of the movable mirror 11. Subsequently, as illustrated in (c) of FIG. 11, the hard mask 90 is separated.

As described above, the optical device 10 can be obtained. Additionally, the optical device 10 is manufactured at the wafer level and dicing is finally performed so as to obtain the plurality of optical devices 10 at the same time. In the method of manufacturing the optical device 10, the mirror surface 11a is formed after forming the electrode pads 121 and 122, but the electrode pads 121 and 122 may be formed after forming the mirror surface 11a. Further, in the method of manufacturing the optical device 10, the support layer 51 is etched after etching the device layer 52 and a metal film (the electrode pad 122 and the mirror surface 11a) is formed by using the hard masks 80 and 90. However, the device layer 52 may be etched after etching the support layer 51 and a metal film may be formed by using the hard masks 80 and 90.

[Operation and Effect]

In the optical device 10, since the movable mirror 11 includes the mirror surface 11a following a plane parallel to the main surface 12a of the base 12, it is possible to enlarge the mirror surface 11a of the movable mirror 11. Further, since the movable mirror 11 including such a mirror surface 11a is connected to the base 12 by the first elastic support portion 14 and the second elastic support portion 15 and is driven in the Z-axis direction, the optical path length can be changed.

In the above-described configuration, since the movable range of the movable mirror 11 is improved and the driving force necessary for driving the movable mirror 11 is reduced as the length of each of the first and second elastic support portions 14 and 15 from a portion in which the first and second elastic support portions 14 and 15 are connected to the base 12 to a portion in which the first and second elastic support portions 14 and 15 are connected to the movable mirror increases, the movable efficiency is also improved. Meanwhile, the arrangement space of the first and second elastic support portions 14 and 15 is enlarged as the length of the first and second elastic support portions 14 and 15 increases. Thus, when the first and second optical function portions 17 and 18 other than the movable mirror 11 are disposed in the base 12, the distance between the movable mirror 11 and the first and second optical function portions 17 and 18 is enlarged in order to secure the arrangement space of the first and second elastic support portions 14 and 15. Accordingly, there is concern that the optical device 10 may be enlarged.

In the optical device 10, the first elastic support portion 14 includes the pair of first levers 141 extending along the main surface 12a from the movable mirror 11 toward both sides of the first optical function portion 17 and the length of each of the pair of first levers 141 in the arrangement direction of the movable mirror 11 and the first optical function portion 17 is larger than the shortest distance between the outer edge of the mirror surface 11a and the edge of the first optical function portion 17. Accordingly, since an increase in the distance between the movable mirror 11 and the first optical function portion 17 is suppressed, it is possible to suppress an increase in the size of the entire device. Further, since the length of each of the pair of first levers 141 in the first elastic support portion 14 is secured, it is possible to suppress deterioration in the movable performance of the movable mirror 11. As described above, according to the optical device 10, it is possible to suppress deterioration in the movable performance of the movable mirror 11 and an increase in the size of the entire device while enlarging the mirror surface 11a of the movable mirror 11.

In the optical device 10, the maximum distance between the pair of first levers 141 in the Y-axis direction is the same as the maximum width of the first optical function portion 17 in the Y-axis direction. For this reason, it is possible to realize the suppressing of an increase in the distance between the movable mirror 11 and the first optical function portion 17 and the securing of the length of each of the pair of first levers 141 with a higher balance.

In the optical device 10, a distance from a portion closest to the mirror surface 11a in the edge of the first optical function portion 17 to the end portion 141b at the side opposite to the movable mirror 11 in each of the pair of first levers 141 is larger than a distance from a portion farthest from the mirror surface 11a in the edge of the first optical function portion 17 to the end portion 141b at the side opposite to the movable mirror 11 in each of the pair of first levers 141. Accordingly, it is possible to realize the suppressing of an increase in the distance between the movable mirror 11 and the first optical function portion 17 and the securing of the length of each of the pair of first levers 141 with a higher balance.

In the optical device 10, the first elastic support portion 14 further includes the pair of second levers 142 extending along the main surface 12a from both sides of the first optical function portion 17 in the Y-axis direction toward the movable mirror 11 and the connection of the pair of first levers 141, the pair of second levers 142, and the base 12 is realized through the plurality of torsion bars 143, 144, and 145. Similarly, the second elastic support portion 15 includes the pair of fourth levers 152 in addition to the pair of third levers 151 and the connection of the pair of third levers 151, the pair of fourth levers 152, and the base 12 is realized through the plurality of torsion bars 153, 154, and 155. Accordingly, it is possible to increase the movable range of the movable mirror 11 and to improve the movable efficiency of the movable mirror 11 (to reduce the driving force necessary for driving the movable mirror 11).

In the optical device 10, the end portion 141a at the side of the movable mirror 11 in each first lever 141 is connected to the movable mirror 11 through the plurality of torsion bars 143 disposed on the same axis parallel to the Y-axis direction. Similarly, the end portion 151a at the side of the movable mirror 11 in each third lever 151 is connected to the movable mirror 11 through the plurality of torsion bars 153 disposed on the same axis parallel to the Y-axis direction. Accordingly, it is possible to shorten the length of each torsion bar 143 disposed on the same axis. Similarly, it is possible to shorten the length of each torsion bar 143 disposed on the same axis. As a result, it is possible to suppress the movement of the movable mirror 11 in the X-axis direction and the rotation of the movable mirror 11 around the axis parallel to the Z-axis direction.

In the first elastic support portion 14 of the optical device 10, the link 146 is laid between the end portions 141a at the side of the movable mirror 11 in the first levers 141 and the link 147 is laid between the end portions 142a at the side opposite to the movable mirror 11 in the second levers 142. Similarly, in the second elastic support portion 15, the link 156 is laid between the end portions 151a at the side of the movable mirror 11 in the third levers 151 and the link 157 is laid between the end portions 152a at the side opposite to the movable mirror 11 in the fourth levers 152. Accordingly, the stability of movement of the movable mirror 11 can be improved. Further, each of the links 146 and 147 extends along the edge of the first optical function portion 17 when viewed from the Z-axis direction. Accordingly, an increase in the size of the entire device can be suppressed.

In the optical device 10, the actuator 16 includes the comb electrodes 161 and 162 disposed along the outer edge of the movable mirror 11. Accordingly, the electrostatic force generated by the comb electrodes 161 and 162 can be efficiently used as the driving force of the movable mirror 11.

In the optical device 10, the main body 111 of the movable mirror 11 is provided with the wall portion 112 surrounding the mirror surface 11a when viewed from the Z-axis direction. Accordingly, since the wall portion 112 functions as a rib, it is possible to suppress the deformation (warping, bending, or the like) of the mirror surface 11a while thinning the main body 111.

In the optical device 10, the first optical function portion 17 is a light passage opening portion provided in the base 12. Accordingly, an optical element such as the fixed mirror 21 can be disposed at a position overlapping the first optical function portion 17 when viewed from the Z-axis direction perpendicular to the main surface 12a of the base 12.

In the optical device 10, the base 12, the movable mirror 11, the actuator 16, the first elastic support portion 14, the second elastic support portion 15, and the first optical function portion 17 are configured by an SOI substrate. Accordingly, it is possible to obtain the optical device 10 in which each configuration is easily and highly accurately formed by an MEMS technology.

In the optical device 10, the second elastic support portion 15 includes the pair of third levers 151 extending along the main surface 12a from the movable mirror 11 toward both sides of the second optical function portion 18 and the length of each of the pair of third levers 151 in the arrangement direction of the movable mirror 11 and the second optical function portion 18 is larger than the shortest distance between the outer edge of the mirror surface 11a and the edge of the second optical function portion 18. Accordingly, it is possible to suppress deterioration in the movable performance of the movable mirror 11 and an increase in the size of the entire device while achieving multi-functionality of the device.

In the method of manufacturing the optical device 10, the hard mask 80 and the hard mask 90 are separately used and the plurality of electrode pads 121 and 122 and the mirror surface 11a are formed by different steps. Accordingly, for example, when the specification of the metal film forming the plurality of electrode pads 121 and 122 is different from the specification of the metal film forming the mirror surface 11a, respectively suitable metal films can be formed.

In the method of manufacturing the optical device 10; an etching is performed on a surface at the side opposite to the intermediate layer 53 in the support layer 51 through a mask subjected to a predetermined patterning so as to form the wall portion 112 of the movable mirror 11. Accordingly, it is possible to prevent the scattering of metal for forming the mirror surface 11a by the wall portion 112 at the time of forming the mirror surface 11a. For this reason, it is possible to reliably prevent the attachment of metal to the vicinity of the mirror surface 11a at the time of forming the mirror surface 11a. Thus, the manufacturing efficiency can be further improved.

[Modified Example]

As described above, an embodiment of the present disclosure has been described, but the present disclosure is not limited to the above-described embodiment. For example, the material and shape of each configuration are not limited to the above-described material and shape and various materials and shapes can be employed. As an example, the drive unit 13 may include an elastic support portion connected to the base 12 and the movable mirror 11 other than the first elastic support portion 14 and the second elastic support portion 15.

The fixed mirror 21 may be disposed right below the first optical function portion 17 as in the optical module 1 and may be also disposed right below the second optical function portion 18. With this configuration, it is possible to suppress deterioration in the movable performance of the movable mirror and an increase in the size of the entire device while achieving multi-functionality of the device by using the second optical function portion 18 in the same manner as the first optical function portion 17. The first optical function portion 17 and the second optical function portion 18 corresponding to light passage opening portions may be void and may be formed of a material having optical transparency with respect to the measurement light L0.

In the configuration illustrated in (a) of FIG. 12, each of the brackets 113 and 114 of the movable mirror 11, the bracket 148 of the first lever 141, and the bracket 158 of the third lever 151 is provided at three positions. In all of the brackets 113 and 114, the bracket 148, and the bracket 158, two of three components are bent in a crank shape to the same side and one of them is bent in a crank shape to the side opposite to the other two components when viewed from the Z-axis direction.

In the configuration illustrated in (a) of FIG. 12, the first elastic support portion 14 includes three torsion bars 143. Each torsion bar 143 is disposed on the same axis parallel to the Y-axis direction. The torsion bar 143 is laid between the front end portion of the bracket 148 and the front end portion of the bracket 113 facing each other. The torsion bar 143 is laid between the bracket 148 and the bracket 113 bent in a crank shape to the opposite side. The second elastic support portion 15 includes three torsion bars 153. Three torsion bars 153 are disposed on the same axis parallel to the Y-axis direction. The torsion bar 153 is laid between the front end portion of the bracket 158 and the front end portion of the bracket 114 facing each other. The torsion bar 153 is laid between the bracket 158 and the bracket 114 bent in a crank shape to the opposite side. The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction.

In the configuration illustrated in (a) of FIG. 12, the first lever 141 and the third lever 151 are respectively connected to the movable mirror 11 through three torsion bars 143 and 153 disposed on the same axis. In this way, the optical device 10 may have a configuration in which each of the brackets 113 and 114 of the movable mirror 11, the bracket 148 of the first lever 141, and the bracket 158 of the third lever 151 is provided at three or more positions. Accordingly, it is possible to shorten the length of each of the plurality of torsion bars 143 and 153 disposed on the same axis as compared with the configuration illustrated in FIG. 3. As a result, it is possible to suppress the movement of the movable mirror 11 in the X-axis direction.

In the configuration illustrated in (b) of FIG. 12, each of the brackets 113 and 114 of the movable mirror 11, the bracket 148 of the first lever 141, and the bracket 158 of the third lever 151 is provided at one position. The bracket 113 and the bracket 158 are bent in a crank shape to the same side when viewed from the Z-axis direction. The bracket 114 and the bracket 148 are bent in a crank shape to the same side (here, the side opposite to the bracket 113) when viewed from the Z-axis direction.

In the configuration illustrated in (b) of FIG. 12, the first elastic support portion 14 includes only one torsion bar 143. The torsion bar 143 is disposed on the axis parallel to the Y-axis direction. The torsion bar 143 is laid between the front end portion of the bracket 148 and the front end portion of the bracket 113 facing each other. The second elastic support portion 15 includes only one torsion bar 153. The torsion bar 153 is disposed on the axis parallel to the Y-axis direction. The torsion bar 153 is laid between the front end portion of the bracket 158 and the front end portion of the bracket 114 facing each other. The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction. In the configuration illustrated in (b) of FIG. 12, the structure is simplified as compared with the configuration illustrated in FIG. 3.

In the configuration illustrated in (a) of FIG. 13, each of the brackets 113 and 114 of the movable mirror 11, the bracket 148 of the first lever 141, and the bracket 158 of the third lever 151 is provided at two positions. All of the brackets 113 and 114, the bracket 148, and the bracket 158 have a shape in which one side and the other side are bent in a crank shape to the opposite side. The pair of torsion bars 143 are disposed on the same axis parallel to the Y-axis direction. The torsion bar 143 is laid between the front end portion of the bracket 148 and the front end portion of the bracket 113 facing each other. The torsion bar 143 is laid between the bracket 148 and the bracket 113 bent in a crank shape to the opposite side. The pair of torsion bars 153 are disposed on the same axis parallel to the Y-axis direction. The torsion bar 153 is laid between the front end portion of the bracket 158 and the front end portion of the bracket 114 facing each other. The torsion bar 153 is laid between the bracket 158 and the bracket 114 bent in a crank shape to the opposite side.

In the configuration illustrated in (b) of FIG. 13, the actuator 16 further includes a pair of electrode support members 163 supporting the pair of comb electrodes 161 and a pair of connection portions 164 connecting the comb electrode 161 and the movable mirror 11 to each other through each electrode support member 163. The pair of electrode support members 163 and the pair of connection portions 164 are configured by the device layer 52. The pair of electrode support members 163 and the pair of connection portions 164 are disposed at one position of both sides of the main body 111 in the Y-axis direction parallel to the main surface 12a.

Each electrode support member 163 is disposed along the outer edge of the movable mirror 11. An end portion 163a of each electrode support member 163 extends toward the first optical function portion 17 and an end portion 163b of each electrode support member 163 extends toward the second optical function portion 18. Each comb electrode 161 extends in the Y-axis direction from the side surface of the corresponding electrode support member 163 and is located between the respective comb fingers of the corresponding comb electrode 162. The pair of connection portions 164 connect the corresponding comb electrode 161 to each side of the movable mirror 11. That is, the pair of comb electrodes 161 are separated from the outer edges of the base 12 and the movable mirror 11 and are disposed along the outer edge of the movable mirror 11. Accordingly, since the pair of comb electrodes 161 are separated from the outer edge of the movable mirror 11, it is possible to highly prevent the attachment of metal to the comb electrodes 161 and 162 at the time of forming the film of the mirror surface 11a.

In the configuration illustrated in (b) of FIG. 13, the movable mirror 11 includes one bracket 113 and one bracket 114. All of the bracket 113 and the bracket 114 are bent in a crank shape to the opposite side when viewed from the Z-axis direction. The first lever 141 includes three brackets 148. The third lever 151 includes three brackets 158. When viewed from the Z-axis direction, two of three brackets 148 have a rectangular shape and one of them is bent in a crank shape to the side opposite to the bracket 113. When viewed from the Z-axis direction, two of three brackets 158 have a rectangular shape and one of them is bent in a crank shape to the side opposite to the bracket 114.

In the configuration illustrated in (b) of FIG. 13, the torsion bar 143 is laid between the front end portion of the bracket 148 and the front end portion of the bracket 113 bent in a crank shape. The torsion bar 143 is laid between the end portions 163a at the side of the first optical function portion 17 in the electrode support members 163 corresponding to the rectangular brackets 148. That is, three torsion bars 143 are respectively connected to one bracket 148 bent in a crank shape and two rectangular brackets 148. The three torsion bars 143 are disposed on the same axis parallel to the Y-axis direction.

In the configuration illustrated in (b) of FIG. 13, the torsion bar 153 is laid between the front end portion of the bracket 158 and the front end portion of the bracket 114 bent in a crank shape. The torsion bar 153 is laid between the end portions 163b at the side of the second optical function portion 18 in the electrode support members 163 corresponding to the rectangular brackets 158. That is, three torsion bars 153 are respectively connected to one bracket 158 bent in a crank shape and two rectangular brackets 158. The three torsion bars 153 are disposed on the same axis parallel to the Y-axis direction. The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction.

In the configuration illustrated in FIGS. 14 to 18, the end portion 141a at the side of the movable mirror 11 in each of the pair of first levers 141 is connected to the movable mirror 11 through the torsion bar or the spring. The end portion 141b at the side opposite to the movable mirror 11 in each of the pair of first levers 141 is connected to the base 12 through the torsion bar. The end portion 151a at the side of the movable mirror 11 in each of the pair of third levers 151 is connected to the movable mirror 11 through the torsion bar or the spring. The end portion 151b at the side opposite to the movable mirror 11 in each of the pair of third levers 151 is connected to the base 12 through the torsion bar. In the configuration illustrated in FIGS. 14 to 18, the pair of second levers 142 and the pair of fourth levers 152 are not provided. Thus, in this configuration, the structures of the first elastic support portion 14 and the second elastic support portion 15 can be simplified.

In the configuration illustrated in FIGS. 14 to 18, the first optical function portion 17 is not a light passage opening portion defined by the pair of first levers 141, the plurality of links 146 and 147, and the like, but a light passage opening portion formed in the SOI substrate 50 separately from the pair of first levers 141 and the like. In this case, the maximum distance between the pair of first levers 141 in the Y-axis direction is larger than the maximum width of the first optical function portion 17 in the Y-axis direction (the maximum width when viewed from the Z-axis direction). Similarly, the second optical function portion 18 is not a light passage opening portion defined by the pair of third levers 151, the plurality of links 156 and 157, and the like, but a light passage opening portion formed in the SOI substrate 50 separately from the pair of third levers 151 and the like. In this case, the maximum distance between the pair of third levers 151 in the Y-axis direction is larger than the maximum width of the second optical function portion 18 in the Y-axis direction (the maximum width when viewed from the Z-axis direction).

In the configuration illustrated in (a) of FIG. 14, the movable mirror 11 includes two brackets 113 and two brackets 114. All of the brackets 113 and the brackets 114 have a rectangular shape when viewed from the Z-axis direction. The first lever 141 includes one bracket 148. The third lever 151 includes one bracket 158. All of the brackets 148 and the brackets 158 have a rectangular shape when viewed from the Z-axis direction.

In the configuration illustrated in (a) of FIG. 14, the front end portion of the bracket 148 is located between two brackets 113 in the Y-axis direction. The torsion bar 143 is laid between the front end portion of each bracket 113 and the front end portion of the bracket 148. That is, two torsion bars 143 are connected to one bracket 148. The two torsion bars 143 are disposed on the same axis parallel to the Y-axis direction with the bracket 148 interposed therebetween.

In the configuration illustrated in (a) of FIG. 14, the front end portion of the bracket 158 is located between two brackets 114 in the Y-axis direction. The torsion bar 153 is laid between the front end portion of each bracket 114 and the front end portion of the bracket 158. That is, two torsion bars 153 are connected to one bracket 158. The two torsion bars 153 are disposed on the same axis parallel to the Y-axis direction with the bracket 158 interposed therebetween.

In the configuration illustrated in (b) of FIG. 14, the movable mirror 11 includes one bracket 113 and one bracket 114. All of the brackets 113 and the brackets 114 have a rectangular shape when viewed from the Z-axis direction. The first lever 141 includes two brackets 148. The third lever 151 includes two brackets 158. All of the brackets 148 and the brackets 158 have a rectangular shape when viewed from the Z-axis direction.

In the configuration illustrated in (b) of FIG. 14, the front end portion of the bracket 113 is located between two brackets 148 in the Y-axis direction. The torsion bar 143 is laid between the front end portion of each bracket 148 and the front end portion of the bracket 113. That is, two torsion bars 143 are connected to one bracket 113. The two torsion bars 143 are disposed on the same axis parallel to the Y-axis direction with the bracket 113 interposed therebetween.

In the configuration illustrated in (b) of FIG. 14, the front end portion of the bracket 114 is located between two brackets 158 in the Y-axis direction. The torsion bar 153 is laid between the front end portion of each bracket 158 and the front end portion of the bracket 114. That is, two torsion bars 153 are connected to one bracket 114. The two torsion bars 153 are disposed on the same axis parallel to the Y-axis direction with the bracket 158 interposed therebetween. In the configuration illustrated in (a) and (b) of FIG. 14, the structure can be further simplified.

Figure 16:
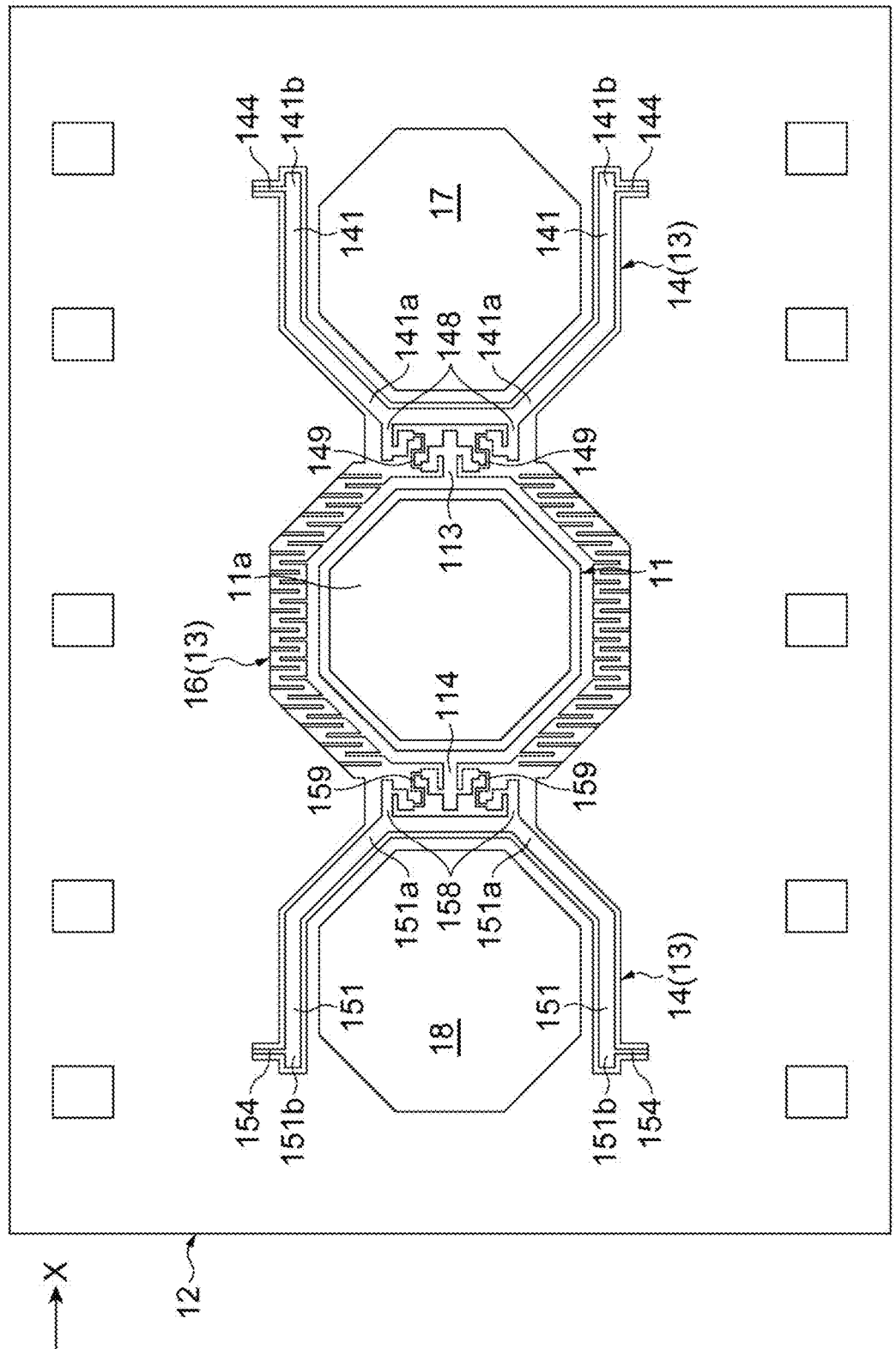
FIG. 16 is a plan view of a modified example of the optical device.

In the configuration illustrated in (a) and (b) of FIG. 15, and FIG. 16, the movable mirror 11 includes one bracket 113 and one bracket 114. All of the brackets 113 and the brackets 114 have a rectangular shape when viewed from the Z-axis direction. The first lever 141 includes two brackets 148. The third lever 151 includes two brackets 158. All of the brackets 148 and the brackets 158 have a rectangular shape when viewed from the Z-axis direction. The front end portion of the bracket 113 is located between two brackets 148 in the Y-axis direction. The front end portion of the bracket 114 is located between two brackets 158 in the Y-axis direction.

In the configuration illustrated in (a) and (b) of FIG. 15, and FIG. 16, the first elastic support portion 14 and the second elastic support portion 15 respectively include a plurality of springs 149 and 159 instead of the torsion bars 143 and 153. The plurality of springs 149 and 159 have a plurality of rotation axes parallel to the Y-axis direction unlike the torsion bars 143 and 153 having only one rotation axis. The spring 149 is laid between the front end portion of each bracket 148 and the front end portion of the bracket 113. That is, two springs 149 are connected to one bracket 113. The spring 159 are laid between the front end portions of two brackets 158 and the front end portion of the bracket 114. That is, two springs 159 are connected to one bracket 114. In the configuration illustrated in (a) and (b) of FIG. 15, and FIG. 16, since the springs 149 and 159 have a plurality of rotation axes parallel to the Y-axis direction, the rotation amount of each rotation axis is reduced as compared with the torsion bars 143 and 153 having only one rotation axis. Further, the impact resistance with respect to the X-axis direction can be improved.

In the configuration illustrated in (a) of FIG. 15, two springs 149 have the same shape. The spring 149 has a shape in which one S-shaped portion is interposed between two Z-shaped portions when viewed from the Z-axis direction. The Z-shaped portion has one rotation axis parallel to the Y-axis direction and the S-shaped portion has three rotation axes parallel to the Y-axis direction. The front end of one Z-shaped portion is connected to one bracket 148 and one end of the S-shaped portion is connected to the other end of the one Z-shaped portion. The front end of the other Z-shaped portion is connected to the other end of the S-shaped portion and the bracket 113 is connected to the other end of the other Z-shaped portion.

In the configuration illustrated in (a) of FIG. 15, two springs 159 have the same shape. The spring 159 has a configuration in which one inverted S-shaped portion (a portion obtained by reversing the S-shaped portion in the left and right direction) is interposed between two inverted Z-shaped portions when viewed from the Z-axis direction. The inverted Z-shaped portion has one rotation axis parallel to the Y-axis direction and the inverted S-shaped portion has three rotation axes parallel to the Y-axis direction. The front end of one inverted Z-shaped portion is connected to one bracket 158 and one end of the inverted S-shaped portion is connected to the other end of the one inverted Z-shaped portion. The front end of the other inverted Z-shaped portion is connected to the other end of the inverted S-shaped portion and the bracket 114 is connected to the other end of the other inverted Z-shaped portion. The first elastic support portion 14 and the second elastic support portion 15 do not have a symmetrical structure with respect to a plane passing through the center of the movable mirror 11 and perpendicular to the Y-axis direction.

In the configuration illustrated in (b) of FIG. 15 and FIG. 16, one spring 149 has a shape in which one S-shaped portion is interposed between two Z-shaped portions when viewed from the Z-axis direction. The Z-shaped portion has one rotation axis parallel to the Y-axis direction and the S-shaped portion has three rotation axes parallel to the Y-axis direction. The other spring 149 has a configuration in which one inverted S-shaped portion is interposed between two inverted Z-shaped portions when viewed from the Z-axis direction. The inverted Z-shaped portion has one rotation axis parallel to the Y-axis direction and the inverted S-shaped portion has three rotation axes parallel to the Y-axis direction. The Z-shaped portion of one spring 149 and the inverted Z-shaped portion of the other spring 149 are respectively connected to the bracket 148.

In the configuration illustrated in (b) of FIG. 15 and FIG. 16, one spring 159 has a shape in which one S-shaped portion is interposed between two Z-shaped portions when viewed from the Z-axis direction. The Z-shaped portion has one rotation axis parallel to the Y-axis direction and the S-shaped portion has three rotation axes parallel to the Y-axis direction. The other spring 159 has a configuration in which one inverted S-shaped portion is interposed between two inverted Z-shaped portions when viewed from the Z-axis direction. The inverted Z-shaped portion has one rotation axis parallel to the Y-axis direction and the inverted S-shaped portion has three rotation axes parallel to the Y-axis direction. The Z-shaped portion of one spring 159 and the inverted Z-shaped portion of the other spring 159 are respectively connected to the bracket 158.

In the structure illustrated in (b) of FIG. 15, one end of the Z-shaped portion of one spring 149 is connected to the bracket 148 and the other end thereof is connected to the S-shaped portion at the side of the movable mirror 11 in relation to one end. One end of the inverted Z-shaped portion of the other spring 149 is connected to the bracket 148 and the other end thereof is connected to the inverted S-shaped portion at the side of the movable mirror 11 in relation to one end. One end of the Z-shaped portion of one spring 159 is connected to the bracket 158 and the other end thereof is connected to the S-shaped portion at the side of the movable mirror 11 in relation to one end. One end of the inverted Z-shaped portion of the other spring 159 is connected to the bracket 158 and the other end thereof is connected to the inverted S-shaped portion at the side of the movable mirror 11 in relation to one end.

In the structure illustrated in FIG. 16, one end of the Z-shaped portion of one spring 149 is connected to the bracket 148 and the other end thereof is connected to the S-shaped portion at the side of the first optical function portion 17 in relation to one end. One end of the inverted Z-shaped portion of the other spring 149 is connected to the bracket 148 and the other end thereof is connected to the inverted S-shaped portion at the side of the first optical function portion 17 in relation to one end. One end of the Z-shaped portion of one spring 159 is connected to the bracket 158 and the other end thereof is connected to the S-shaped portion at the side of the second optical function portion 18 in relation to one end. One end of the inverted Z-shaped portion of the other spring 159 is connected to the bracket 158 and the other end thereof is connected to the inverted S-shaped portion at the side of the second optical function portion 18 in relation to one end.

In the configuration illustrated in (a) of FIG. 17, all of the brackets 113 and 114, the bracket 148, the bracket 158, the torsion bar 143, and the torsion bar 153 have the same configuration as that of (a) of FIG. 12. The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction. Each of the brackets 113 and 114 of the movable mirror 11, the bracket 148 of the first lever 141, and the bracket 158 of the third lever 151 is provided at three positions. The first elastic support portion 14 includes three torsion bars 143. The second elastic support portion 15 includes three torsion bars 153. In this way, the optical device 10 may have a configuration in which each of the brackets 113 and 114 of the movable mirror 11, the bracket 148 of the first lever 141, and the bracket 158 of the third lever 151 is provided at three or more positions. Accordingly, it is possible to shorten the length of each of the plurality of torsion bars 143 and 153 disposed on the same axis as compared with the configuration illustrated in FIG. 3. As a result, it is possible to suppress the movement of the movable mirror 11 in the X-axis direction.

In the configuration illustrated in (b) of FIG. 17, all of the brackets 113 and 114, the bracket 148, the bracket 158, the torsion bar 143, and the torsion bar 153 have the same configuration as that of (b) of FIG. 12. The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction. Each of the brackets 113 and 114 of the movable mirror 11, the bracket 148 of the first lever 141, and the bracket 158 of the third lever 151 is provided at one position. The first elastic support portion 14 includes only one torsion bar 143. The second elastic support portion 15 includes only one torsion bar 153. Accordingly, the structure is simplified as compared with the configuration illustrated in FIG. 3.

In the configuration illustrated in (a) of FIG. 18, all of the brackets 113 and 114, the bracket 148, the bracket 158, the torsion bar 143, and the torsion bar 153 have the same configuration as that of FIG. 3. The first elastic support portion 14 and the second elastic support portion 15 do not have a symmetrical structure in a plane passing through the center of the movable mirror 11 and perpendicular to the X-axis direction and a plane passing through the center of the movable mirror 11 and perpendicular to the Y-axis direction. Each of the brackets 113 and 114 of the movable mirror 11, the bracket 148 of the first lever 141, and the bracket 158 of the third lever 151 is provided at two positions. The first elastic support portion 14 includes two torsion bars 143. The second elastic support portion 15 includes two torsion bars 153.

In the configuration illustrated in (b) of FIG. 18, all of the brackets 113 and 114, the bracket 148, the bracket 148, the torsion bar 143, and the torsion bar 153 have the same configuration as that of (a) of FIG. 13. Each of the brackets 113 and 114 of the movable mirror 11, the bracket 148 of the first lever 141, and the bracket 158 of the third lever 151 is provided at two positions. The first elastic support portion 14 includes two torsion bars 143. The second elastic support portion 15 includes two torsion bars 153.

Figure 19:
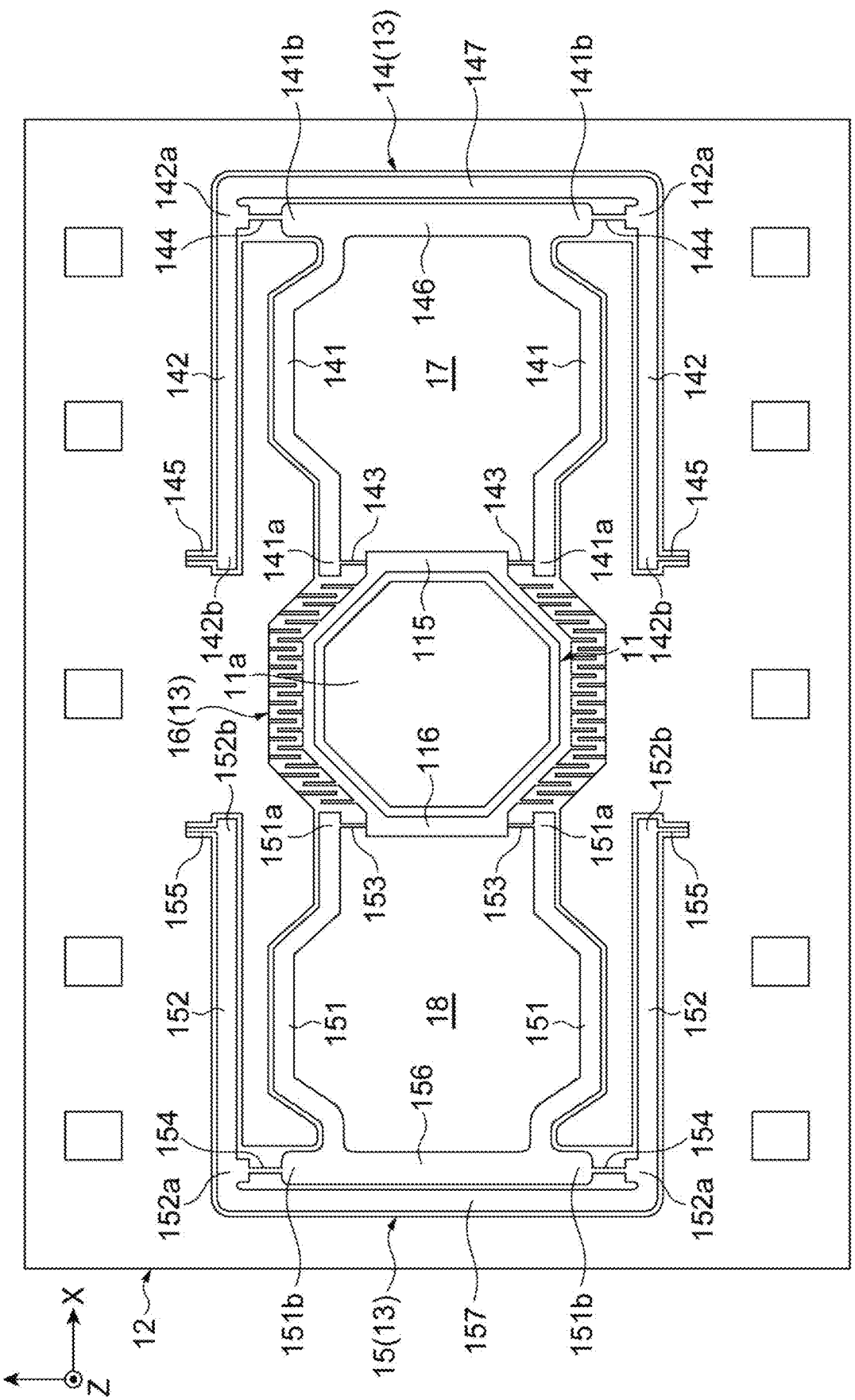
FIG. 19 is a plan view of a modified example of the optical device.

In the configuration illustrated in FIG. 19, the movable mirror 11 includes a pair of flanges 115 and 116 instead of the pair of brackets 113 and the pair of brackets 114. The pair of flanges 115 and 116 are formed by the device layer 52. The end portion 141a of each first lever 141 is located at both sides of the flange 115 in the Y-axis direction. The first optical function portion 17 is defined by at least the flange 115, the pair of first levers 141, and the link 146. The torsion bar 143 is laid between each end portion 141a and the flange 115. That is, the end portion 141a of each first lever 141 is connected to the movable mirror 11 through the pair of torsion bars 143. The pair of torsion bars 143 are disposed on the same axis parallel to the Y-axis direction.

The pair of first levers 141 extend along the main surface 12a of the base 12 from the movable mirror 11 toward both sides of the first optical function portion 17 in the Y-axis direction. The torsion bar 144 is laid between the end portion 141b of one first lever 141 and the end portion 142a of one second lever 142 and between the end portion 141b of the other first lever 141 and the end portion 142a of the other second lever 142.

In the configuration illustrated in FIG. 19, the link 146 is laid between the end portions 141b of the first levers 141. The link 146 extends in the Y-axis direction along the edge of the first optical function portion 17. The link 147 extends in the Y-axis direction along the link 146 at the side opposite to the first optical function portion 17 with respect to the link 146.

In the configuration illustrated in FIG. 19, the end portion 151a of each third lever 151 is located at both sides of the flange 116 in the Y-axis direction. The second optical function portion 18 is defined by at least the flange 116, the pair of third levers 151, and the link 156. The torsion bar 153 is laid between each end portion 151a and the flange 116. That is, the end portion 151a of each third lever 151 is connected to the movable mirror 11 through the pair of torsion bars 153. The pair of torsion bars 153 are disposed on the same axis parallel to the Y-axis direction.

The pair of third levers 151 extend along the main surface 12a of the base 12 from the movable mirror 11 toward both sides of the second optical function portion 18 in the Y-axis direction. The torsion bar 154 is laid between the end portion 151b of one third lever 151 and the end portion 152a of one fourth lever 152 and between the end portion 151b of the other third lever 151 and the end portion 152a of the other fourth lever 152.

In the configuration illustrated in FIG. 19, the link 156 is laid between the end portions 151b of the third levers 151. The link 156 extends along the edge of the second optical function portion 18 in the Y-axis direction. The link 157 extends in the Y-axis direction along the link 156 at the side opposite to the second optical function portion 18 with respect to the link 156.

Figure 20:
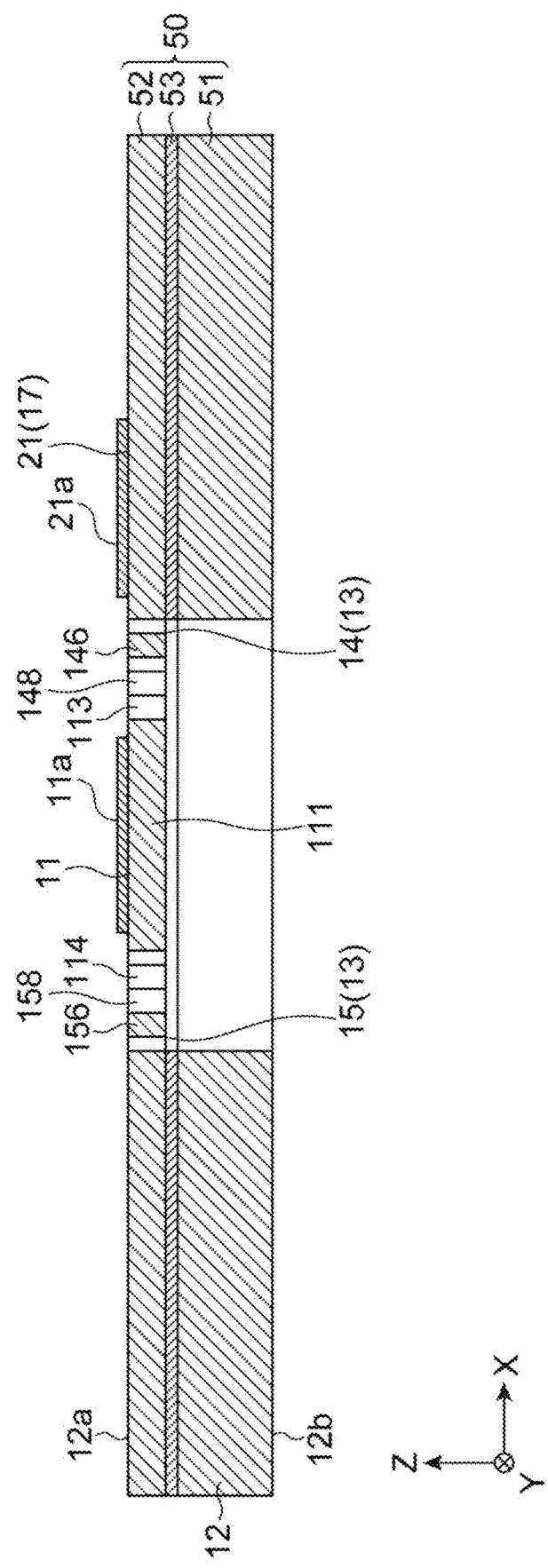
FIG. 20 is a longitudinal sectional view of a modified example of the optical device.
Figure 21:
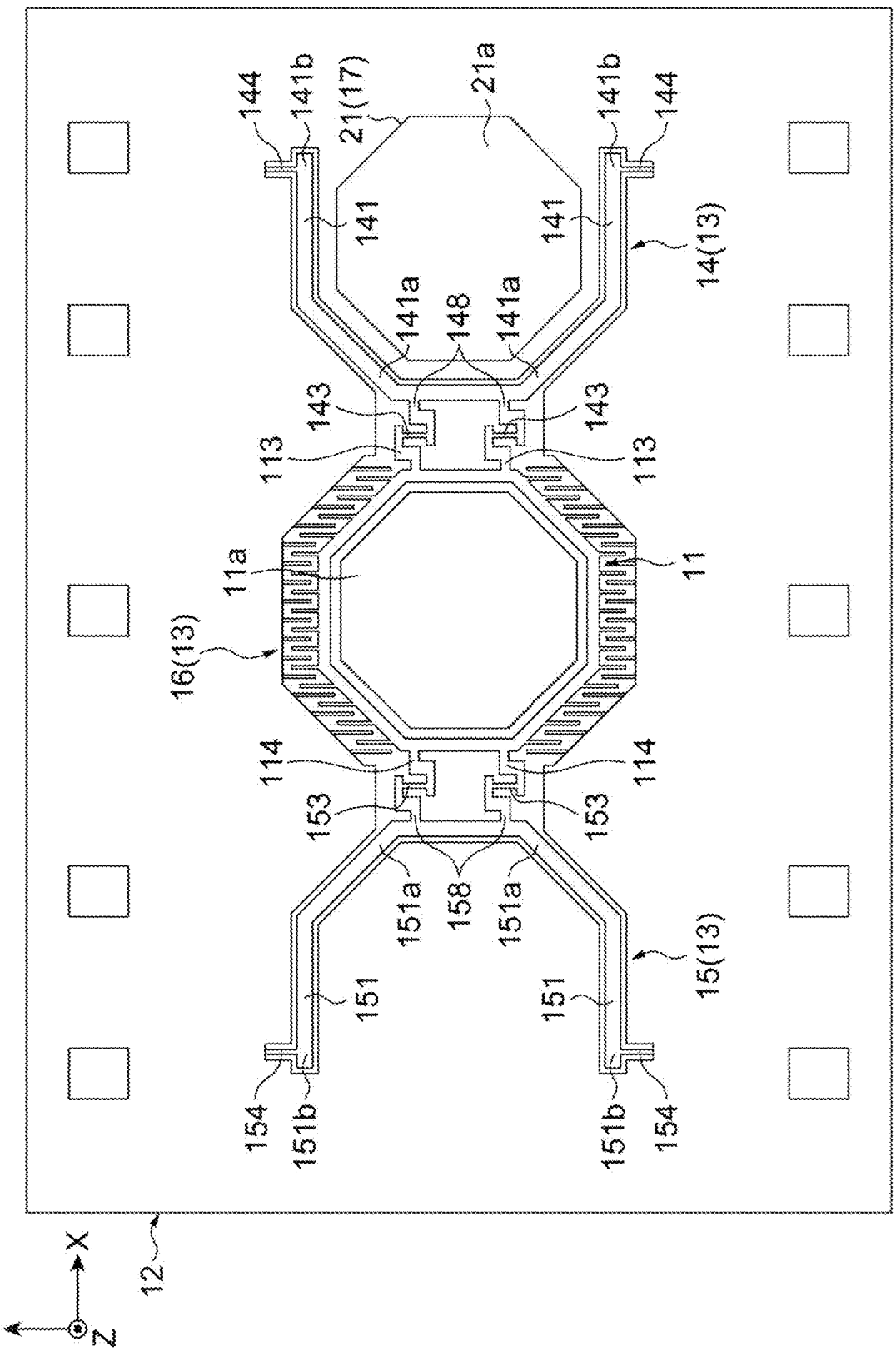
FIG. 21 is a plan view of the modified example of the optical device illustrated in FIG. 20.

In the configuration illustrated in FIGS. 20 and 21, the movable mirror 11 is not provided with the wall portion 112 and the surface at the side of the main surface 12a in the main body 111 is provided with the metal film so that the mirror surface 11a is provided. Further, the fixed mirror 21 (the mirror surface 21a) is provided as the first optical function portion 17 at one side of the movable mirror 11 in the X-axis direction when viewed from the Z-axis direction. The fixed mirror 21 is provided on the main surface 12a of the device layer 52. That is, in the configuration illustrated in FIGS. 20 and 21, the light passage opening portions functioning as the first optical function portion 17 and the second optical function portion 18 are not formed in the SOI substrate 50. Additionally, in the configuration illustrated in FIGS. 20 and 21, all of the brackets 113 and 114, the bracket 148, the bracket 158, the torsion bar 143, and the torsion bar 153 have the same configuration as that of FIG. 18. With the configuration illustrated in FIGS. 20 and 21, it is possible to realize the optical device 10 including the movable mirror 11 and the fixed mirror 21 while suppressing an increase in the size of the entire device.

In the configuration illustrated in FIGS. 20 and 21, when the movement region of the movable mirror 11 is secured, the fixed mirror 21 and the support body 22 located right below the first optical function portion 17 may not be provided. In this configuration, in the above-described embodiment, the light reflected by the fixed mirror 21 is reflected by the first optical function portion 17. In this case, it is desirable to adjust each of the optical paths P1 and P2 inside the beam splitter unit 3 at the front stage portion of the first optical function portion 17 so that the optical path difference of the light divided by the half mirror surface 31 is corrected.

In the configuration illustrated in FIGS. 20 and 21, the fixed mirror 21 may be provided at one side of the movable mirror 11 in the X-axis direction as the first optical function portion 17 and may be provided at the other side of the movable mirror 11 in the X-axis direction as the second optical function portion 18 when viewed from the Z-axis direction. With this configuration, it is possible to suppress deterioration in the movable performance of the movable mirror and an increase in the size of the entire device while achieving multi-functionality of the device by using the second optical function portion 18 in the same manner as the first optical function portion 17.

The actuator is not limited to an electrostatic actuator and may be, for example, a piezoelectric actuator, an electromagnetic actuator, or the like. Further, the optical module 1 is not limited to one constituting the FTIR and may be one constituting another optical system.

Each configuration in one embodiment or modified example described above can be arbitrarily applied to each configuration in another embodiment or modified example.

REFERENCE SIGNS LIST

10: optical device, 11: movable mirror, 11a: mirror surface, 12: base, 12a: main surface, 14: first elastic support portion, 15: second elastic support portion, 16: actuator, 17: first optical function portion, 18: second optical function portion, 50: SOI substrate, 111: main body, 112: wall portion, 141: first lever, 141a, 141b: end portion, 142: second lever, 142a, 142b: end portion, 143, 144, 145: torsion bar, 151: third lever, 161, 162: comb electrode, 164: connection portion.

The invention claimed is:
1. An optical device comprising:
a base which includes a main surface;
a movable mirror which includes a mirror surface following a plane parallel to the main surface;
a first elastic support portion and a second elastic support portion which are connected to the base and the movable mirror and support the movable mirror so as to be movable along a first direction perpendicular to the main surface;
an actuator which moves the movable mirror along the first direction; and
a first light passage which is disposed at one side of the movable mirror in a second direction perpendicular to the first direction when viewed from the first direction, the first light passage is a light passage having an optical path,
wherein the first elastic support portion includes a pair of first levers extending along the main surface from the movable mirror toward both sides of the first light passage in a third direction perpendicular to the first direction and the second direction,
wherein the movable mirror includes a main body having a surface parallel to the main surface, the surface provided with the mirror surface,
wherein a length of each of the pair of first levers in the second direction is larger than the shortest distance between an outer edge of the mirror surface and an edge of the light passage, and
wherein the edge of the light passage is separated from an outer edge of the main body and the shortest distance between the outer edge of the mirror surface and the edge of the light passage is larger than 0.

2. The optical device according to claim 1, wherein a maximum distance between the pair of first levers in the third direction is equal to or larger than a maximum width of the first light passage in the third direction.

3. The optical device according to claim 1, wherein a distance from a portion closest to the mirror surface in the edge of the first light passage to an end portion at the side opposite to the movable mirror in each of the pair of first levers is larger than a distance from a portion farthest from the mirror surface in the edge of the first light passage to the end portion at the side opposite to the movable mirror in each of the pair of first levers.

4. The optical device according to claim 1, wherein the first elastic support portion further includes a pair of second levers extending along the main surface from both sides of the first light passage in the third direction toward the movable mirror,
wherein an end portion at the side of the movable mirror in each of the pair of first levers is connected to the movable mirror through at least one torsion bar,
wherein an end portion at the side opposite to the movable mirror in each of the pair of first levers is connected to an end portion at the side opposite to the movable mirror in each of the pair of second levers through at least one torsion bar, and
wherein an end portion at the side of the movable mirror in each of the pair of second levers is connected to the base through at least one torsion bar.

5. The optical device according to claim 1, wherein an end portion at the side of the movable mirror in each of the pair of first levers is connected to the movable mirror through at least one torsion bar, and
wherein an end portion at the side opposite to the movable mirror in each of the pair of first levers is connected to the base through at least one torsion bar.

6. The optical device according to claim 4, wherein the end portion at the side of the movable mirror in each of the pair of first levers is connected to the movable mirror through a plurality of torsion bars disposed on the same axis parallel to the third direction.

7. The optical device according to claim 1, wherein the actuator includes a comb electrode disposed along an outer edge of the movable mirror.

8. The optical device according to claim 7, wherein the comb electrode is separated from the outer edge of the movable mirror, and
wherein the actuator further includes a connection portion connecting the comb electrode and the movable mirror to each other.

9. The optical device according to claim 1, wherein the movable mirror further includes a wall portion provided to the main body and surrounding the mirror surface when viewed from the first direction.

10. The optical device according to claim 1, wherein the first light passage is a light passage opening provided to the base.

11. The optical device according to claim 1, wherein the base, the movable mirror, the actuator, the first elastic support portion, the second elastic support portion, and the first light passage are configured by an SOI substrate.

12. The optical device according to claim 1, further comprising:
a second light passage or a fixed mirror, provided to the base, which is disposed at the other side of the movable mirror in the second direction when viewed from the first direction,
wherein the second elastic support portion includes a pair of third levers extending along the main surface from the movable mirror toward both sides of the second light passage or the fixed mirror in the third direction, and
wherein a length of each of the pair of third levers in the second direction is larger than the shortest distance between the outer edge of the mirror surface and an edge of the second light passage or the fixed mirror.

13. The optical device according to claim 5, wherein the end portion at the side of the movable mirror in each of the pair of first levers is connected to the movable mirror through a plurality of torsion bars disposed on the same axis parallel to the third direction.

14. An optical device comprising:
a base which includes a main surface;
a movable mirror which includes a mirror surface following a plane parallel to the main surface;
a first elastic support portion and a second elastic support portion which are connected to the base and the movable mirror and support the movable mirror so as to be movable along a first direction perpendicular to the main surface;
an actuator which moves the movable mirror along the first direction; and
a first fixed mirror, provided to the base, which is disposed at one side of the movable mirror in a second direction perpendicular to the first direction when viewed from the first direction,
wherein the first elastic support portion includes a pair of first levers extending along the main surface from the movable mirror toward both sides of the first fixed mirror in a third direction perpendicular to the first direction and the second direction, and
wherein a length of each of the pair of first levers in the second direction is larger than the shortest distance between an outer edge of the mirror surface and an edge of the first fixed mirror.

15. The optical device according to claim 14, wherein a maximum distance between the pair of first levers in the third direction is equal to or larger than a maximum width of the first fixed mirror in the third direction.

16. The optical device according to claim 14, wherein a distance from a portion closest to the mirror surface in the edge of the first fixed mirror to an end portion at the side opposite to the movable mirror in each of the pair of first levers is larger than a distance from a portion farthest from the mirror surface in the edge of the first fixed mirror to the end portion at the side opposite to the movable mirror in each of the pair of first levers.

17. The optical device according to claim 14, wherein the first elastic support portion further includes a pair of second levers extending along the main surface from both sides of the first fixed mirror in the third direction toward the movable mirror,
wherein an end portion at the side of the movable mirror in each of the pair of first levers is connected to the movable mirror through at least one torsion bar,
wherein an end portion at the side opposite to the movable mirror in each of the pair of first levers is connected to an end portion at the side opposite to the movable mirror in each of the pair of second levers through at least one torsion bar, and wherein an end portion at the side of the movable mirror in each of the pair of second levers is connected to the base through at least one torsion bar.

18. The optical device according to claim 14, wherein an end portion at the side of the movable mirror in each of the pair of first levers is connected to the movable mirror through at least one torsion bar, and wherein an end portion at the side opposite to the movable mirror in each of the pair of first levers is connected to the base through at least one torsion bar.

19. The optical device according to claim 17, wherein the end portion at the side of the movable mirror in each of the pair of first levers is connected to the movable mirror through a plurality of torsion bars disposed on the same axis parallel to the third direction.

20. The optical device according to claim 14, wherein the actuator includes a comb electrode disposed along an outer edge of the movable mirror.

21. The optical device according to claim 20, wherein the comb electrode is separated from the outer edge of the movable mirror, and wherein the actuator further includes a connection portion connecting the comb electrode and the movable mirror to each other.

22. The optical device according to claim 14, wherein the movable mirror includes a main body provided with the mirror surface and a wall portion provided to the main body and surrounding the mirror surface when viewed from the first direction.

23. The optical device according to claim 14, wherein the base, the movable mirror, the actuator, the first elastic support portion, the second elastic support portion, and the first fixed mirror are configured by an SOI substrate.

24. The optical device according to claim 14, further comprising:

a light passage or a second fixed mirror which is disposed at the other side of the movable mirror in the second direction when viewed from the first direction, wherein the second elastic support portion includes a pair of third levers extending along the main surface from the movable mirror toward both sides of the light passage or the second fixed mirror in the third direction, and wherein a length of each of the pair of third levers in the second direction is larger than the shortest distance between the outer edge of the mirror surface and an edge of the light passage or the second fixed mirror.

25. The optical device according to claim 18, wherein the end portion at the side of the movable mirror in each of the pair of first levers is connected to the movable mirror through a plurality of torsion bars disposed on the same axis parallel to the third direction.

* * * * *